United States Patent [19]
Kim

[11] Patent Number: 5,547,889
[45] Date of Patent: Aug. 20, 1996

[54] METHOD OF FORMING A SEMICONDUCTOR DEVICE HAVING VERTICAL CONDUCTION TRANSISTORS AND CYLINDRICAL CELL GATES

[75] Inventor: Hyoung-sub Kim, Suwon, Rep. of Korea

[73] Assignee: Samsung Electronics Co. Ltd., Suwon, Rep. of Korea

[21] Appl. No.: 442,713

[22] Filed: May 8, 1995

Related U.S. Application Data

[62] Division of Ser. No. 246,227, May 18, 1994, Pat. No. 5,460,994.

[30] Foreign Application Priority Data

Mar. 28, 1994 [KR] Rep. of Korea ............... 94-6232

[51] Int. Cl.⁶ ..................... H01L 21/70; H01L 27/00
[52] U.S. Cl. ................ 437/52; 437/47; 437/203; 437/919
[58] Field of Search ................ 437/47, 52, 60, 437/203, 919; 257/302–310

[56] References Cited

U.S. PATENT DOCUMENTS 4,921,815  5/1990  Miyazawa ................... 437/52
5,106,775  4/1992  Kaga et al. .................. 437/52
5,316,962  5/1994  Matsuo et al. ............... 437/52
5,372,964  12/1994  Gotou ......................... 437/52

*Primary Examiner*—H. Jey Tsai
*Attorney, Agent, or Firm*—Cushman Darby & Cushman, L.L.P.

[57] ABSTRACT

A semiconductor device, e.g., a DRAM, having vertical conduction transistors and cylindrical cell gates, which includes a plurality of spaced-apart trench isolation regions formed in a semiconductor substrate, a plurality of bit lines formed on the semiconductor substrate, a silicon pillar formed on each bit line, a gate insulating layer and gate line formed on each silicon pillar in surrounding relationship thereto, a planarizing layer formed in recesses in the gate lines, an insulating layer formed on the upper surfaces of the gate line and planarizing layer, a plurality of contact holes provided in vertically aligned portions of the insulating layer, the gate line, and the gate insulating layer located above respective ones of the silicon pillars, and, a storage node of a capacitor formed with the contact holes and adjacent surface portions of the insulating layer, in contact with the source region of respective ones of the silicon pillars. Each of the silicon pillars includes vertically stacked layers which serve as respective drain, channel, and source regions of a transistor.

3 Claims, 23 Drawing Sheets

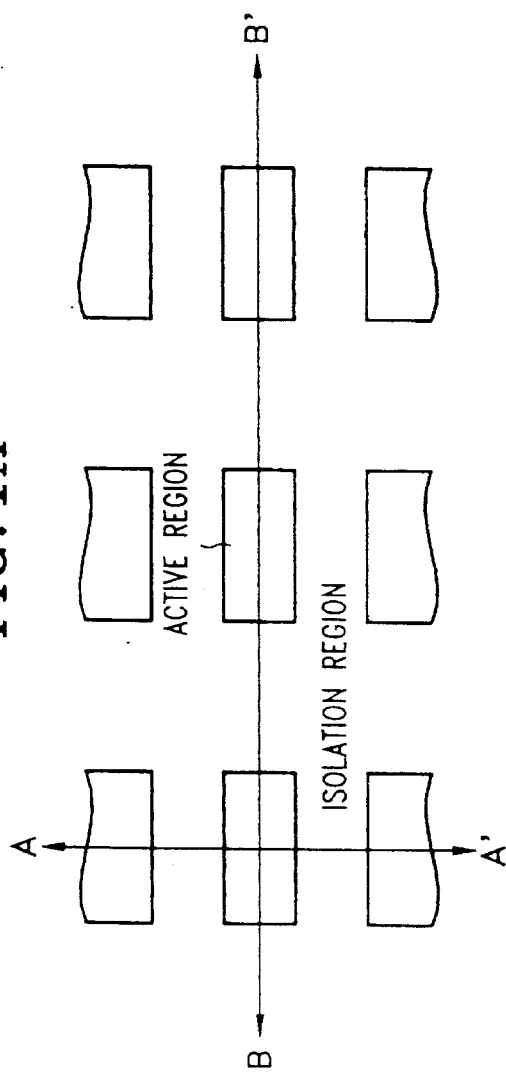
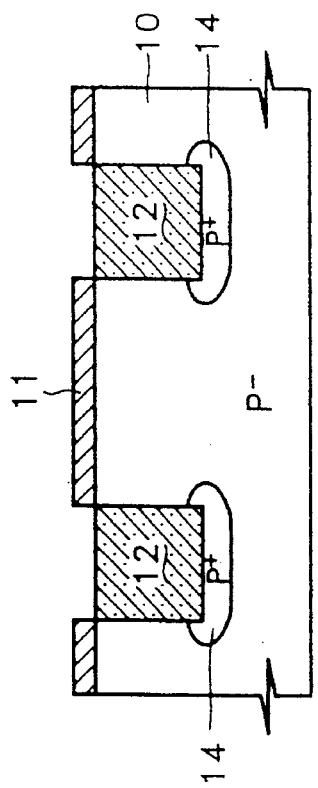
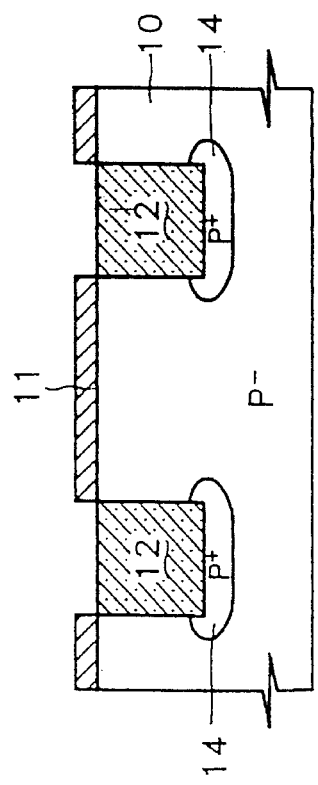

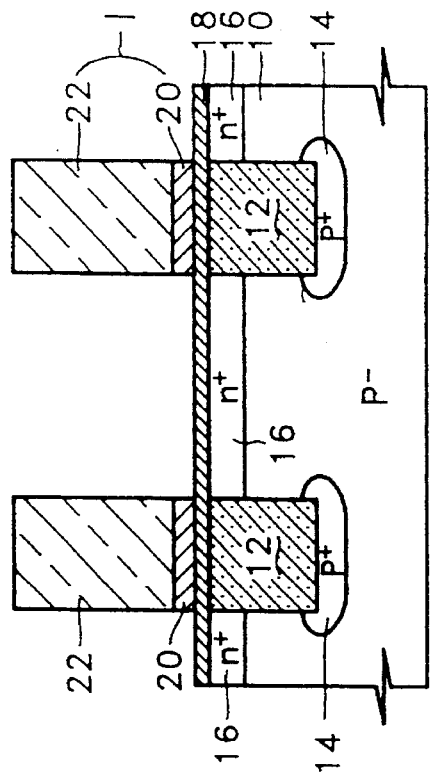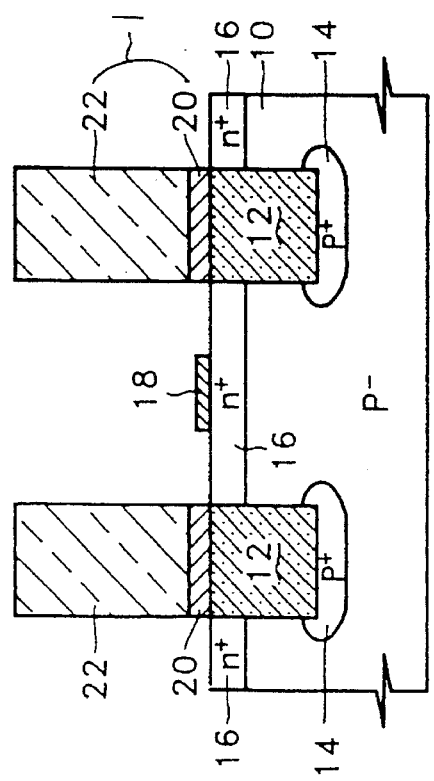

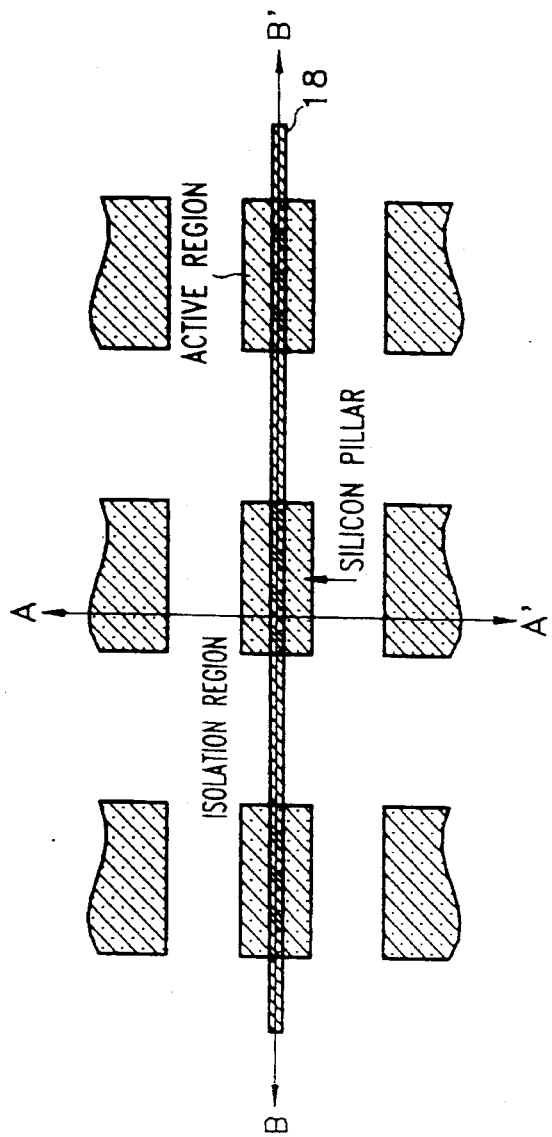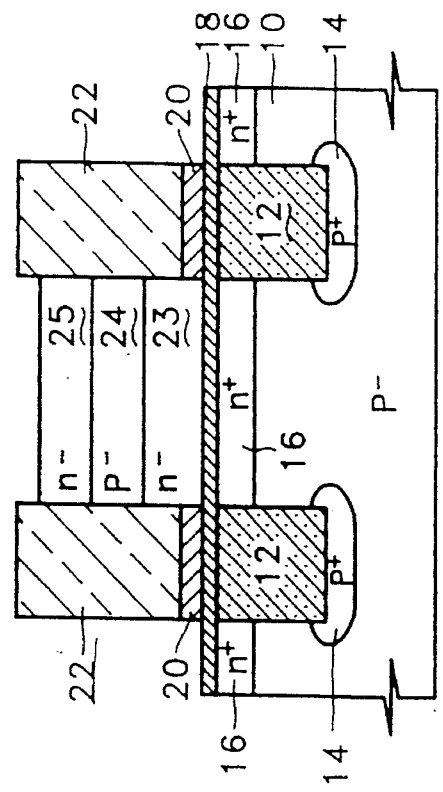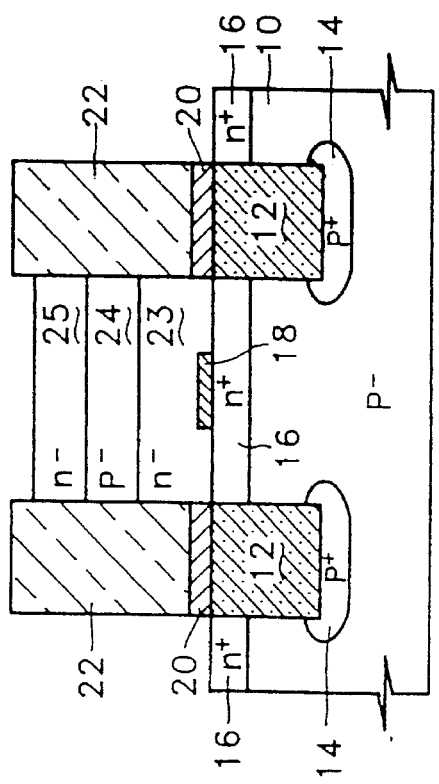

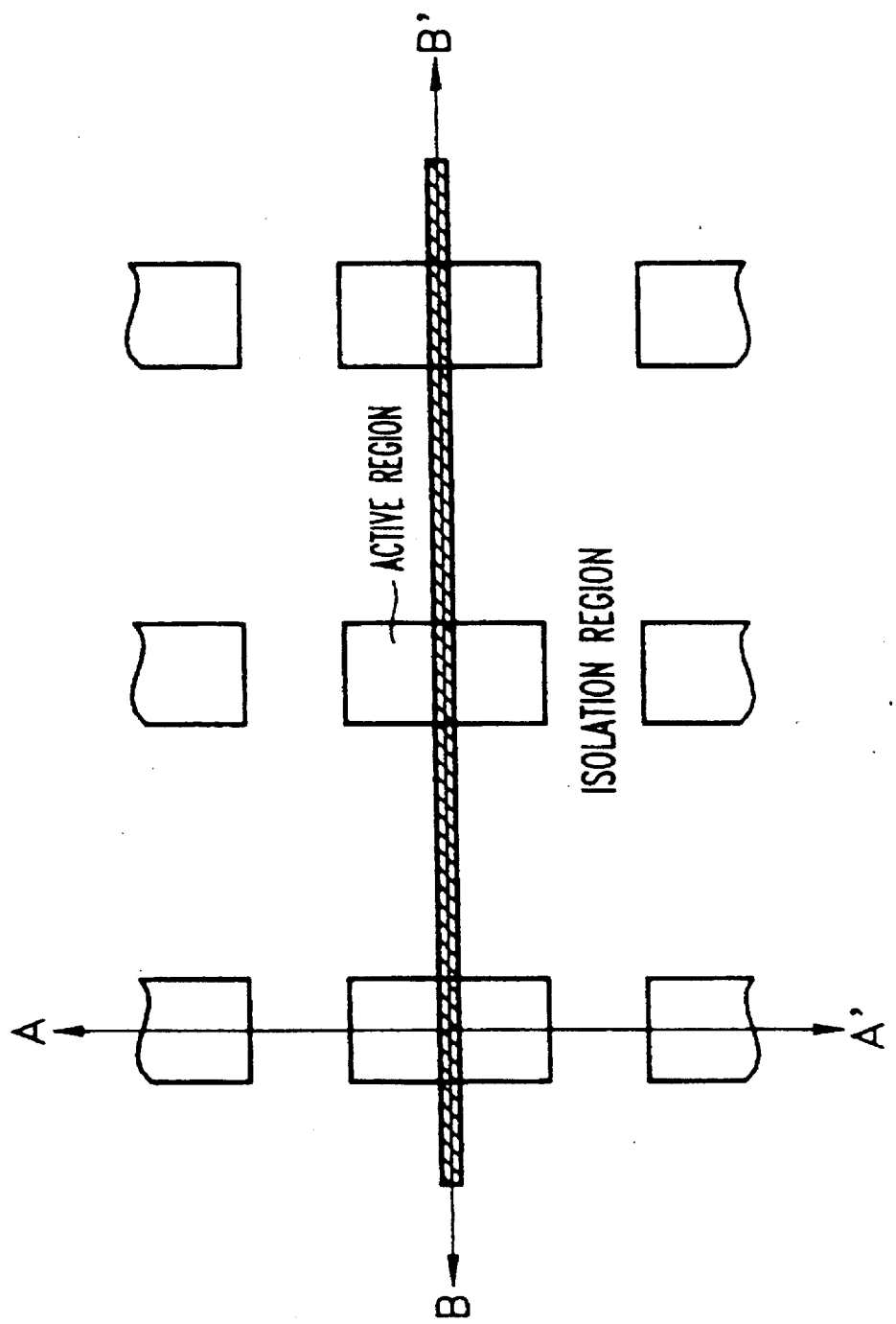

METHOD OF FORMING A SEMICONDUCTOR DEVICE HAVING VERTICAL CONDUCTION TRANSISTORS AND CYLINDRICAL CELL GATES

This is a division of application Ser. No. 08/246,227, filed May 18, 1994, U.S. Pat. No. 5,460,994.

BACKGROUND OF THE INVENTION

The present invention relates generally to semiconductor devices, and more particularly, to a semiconductor device having buried bit lines and cylindrical cell gates, and a method for manufacturing the same.

As a general rule, the density of dynamic random access memory devices (DRAMs) has quadrupled every three years. At the present time, 16 Mb DRAMs are in mass production, 64 Mb DRAMs are about to enter into mass production, and 1 Gb DRAMs are in an earlier stage of development.

The memory cell of one gigabit (1 Gb) DRAMs will occupy less than 0.3 $\mu m^2$ area. This is the same area needed for just the contact hole in a one mega bit (1 Mb) DRAM cell. Forming one transistor, one capacitor, and one contact hole in such a small area is exceedingly difficult.

In general, the chip surface area of semiconductor memory devices is increased by approximately 1.4× for each 4× increase in the cell packing density thereof, which results in an approximately ⅓ reduction in the surface area available for each memory cell. Therefore, for each new generation of semiconductor memories, it has become necessary to increase the capacitance to surface area ratio of each memory cell in order to achieve sufficiently large memory cell capacitance. Past techniques for achieving this can be broadly classified into the following three categories:

(1) decreasing the thickness of the dielectric film of the memory cell capacitors;

(2) increasing the dielectric constant of the dielectric film; and, (3) increasing the effective area of the storage electrode of the memory cell capacitors.

With respect to the first technique enumerated above, the lower practical limit of dielectric film thickness is approximately 100 Å, because the reliability of the memory cells becomes unacceptably degraded when the thickness of the dielectric film is less than 100 Å, due to the creation of Fowler-Nordheim currents. With respect to the second technique enumerated above, the most promising high dielectric constant dielectric film material is tantalum pentoxide ($Ta_2O_5$), which provides good coverage with respect to three-dimensional memory cell structures having a high aspect ratio. However, tantalum pentoxide exhibits a high leakage current and a low breakdown voltage in a thin film state, thus limiting its utility with respect to the ultra-high capacity memories currently under development.

Consequently, the bulk of the current development efforts have been focused on the third technique enumerated above, namely, increasing the effective area of the storage electrode of the memory cell capacitors. Historically, as the need for memory cells having a large capacitance to surface area ratio has increased in parallel with the continuing development of memories having increased cell packing densities, the structure of memory cell capacitors has evolved from planar-type capacitors to three dimensional stack-type and trench-type capacitors, culminating at the present time in a stacked trench-type capacitor which is a hybrid of the stack-type and trench-type capacitors.

Additionally, it is possible to increase cell packing density by reducing the distance between isolation regions, and by forming contact holes without using additional active area.

K. Sunouchi et al. suggest an SGT memory cell wherein all devices for the memory cell are formed in one silicon pillar isolated by matrix-like trenches (see IEDM '89, "A Surrounding Gate Transistor (SGT) cell for 64/256 Mbit DRAMs"). However, the SGT cell has the following problems.

First, the process of forming the silicon pillar and capacitor are complex. Secondly, the isolation characteristics are poor. Thirdly, there is a large possibility that a short between a capacitor plate node and a gate electrode will occur during the process for forming the gate electrode.

SUMMARY OF THE INVENTION

Accordingly, it is an object of the present invention to provide a highly integrated semiconductor device which overcomes the disadvantages and shortcomings of the presently available devices, and a method for manufacturing the same.

In this connection, the present invention encompasses a semiconductor device comprising:

a semiconductor substrate;

a trench isolation region formed in the semiconductor substrate;

a bit line formed on the semiconductor substrate wherein the trench isolation region is formed;

a silicon pillar formed on the bit line, and having a drain, a channel, and a source region of a transistor which are sequentially formed from a lower portion of the silicon pillar to an upper portion thereof;

a gate insulating film and a gate line formed sequentially so as to surround the silicon pillar;

a planarizing layer formed between the adjacent gate lines;

an insulating layer formed on the gate lines, having a contact hole for exposing the source region of the transistor; and a storage node of a capacitor formed on the insulating layer connected to the source region of the transistor through the contact hole.

The present invention also encompasses a method for manufacturing a highly integrated semiconductor device comprising the steps of:

forming a trench isolation region to define an active region in a semiconductor substrate of a first conductivity type;

forming a bit line on the semiconductor substrate wherein the trench isolation region is formed;

forming an insulating film pillar, comprised of a first insulating layer and a second insulating layer stacked on the first insulating layer, only on the trench isolation region;

forming a silicon pillar wherein a drain, a channel, and a source region of a transistor are formed sequentially from a lower portion of the silicon pillar to an upper portion thereof, on exposed portions of the semiconductor substrate;

removing the second insulating film;

forming a gate insulating film and a gate line sequentially so as to surround the silicon pillar;

depositing an insulating material on the resultant structure wherein the gate line is formed, and etching back the insulating material to thereby form a planarizing layer;

forming an insulating layer on the resultant structure wherein the planarizing layer is formed;

etching the insulating layer partially to thereby form a contact hole to expose the source region in the silicon pillar; and forming a storage node of a capacitor connected to the source region though the contact hole, on the resultant structure wherein the contact hole is formed.

According to the present invention, a buried bit line structure and a vertical gate structure surrounding a silicon pillar are provided and thus, the maximum effective active area can be utilized.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIGS. 1A–1C, 2A–2C, 3A–3B, 4A–4D, 5A–5C, 6A–6B, 7A–7B, 8A–8B, 9, 10 illustrate a method for manufacturing a semiconductor device according to a first embodiment of the present invention;

FIGS. 18, 19, 20A–20B, 21A–21C, 22A–22B, 23A–23B, 24, 25 and 26 illustrate a method for manufacturing a semiconductor device according to a third embodiment of the present invention.

DETAILED DESCRIPTION OF THE INVENTION

FIGS. 1A to 1C show the steps of forming a trench isolation region 12, wherein FIGS. 1B and 1C are cross-sectional views taken along lines AA' and BB' in FIG. 1A, respectively. A nitride is deposited on a first conductivity type, e.g., a p– type, semiconductor substrate 10 and is patterned by a lithographic process, to thereby form a nitride pattern 11 on portions of the upper surface where active regions of a semiconductor substrate 10 will be formed. Then, substrate 10 is etched to a predetermined depth, using nitride pattern 11 as an etch-mask, to thereby form a trench. Next, p+ type impurity ions are implanted through the trench for enhancing the electrical isolation characteristics between devices, thereby forming a p+ impurity layer 14 beneath the trench. Then, an insulating material, e.g., an oxide, is deposited on the entire surface of the substrate 10 and is etched back, so as to fill the interior of the trench with the insulating material, thereby forming trench isolation region 12.

Figure 2A:
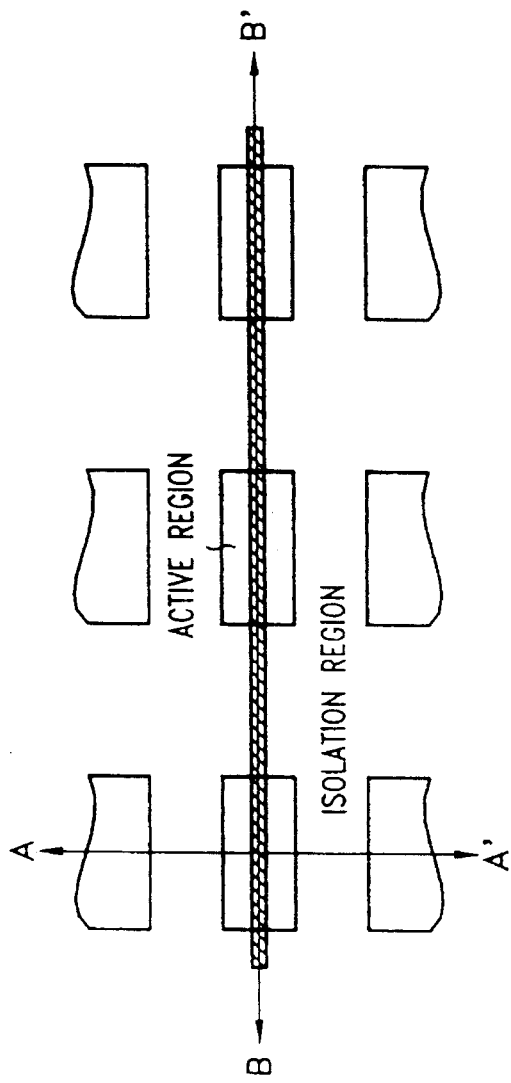
Figure 2C:
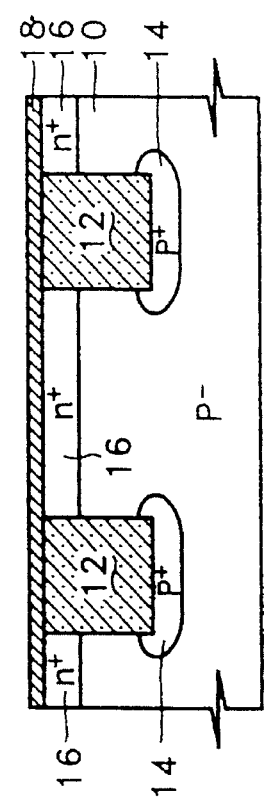
Figure 2B:
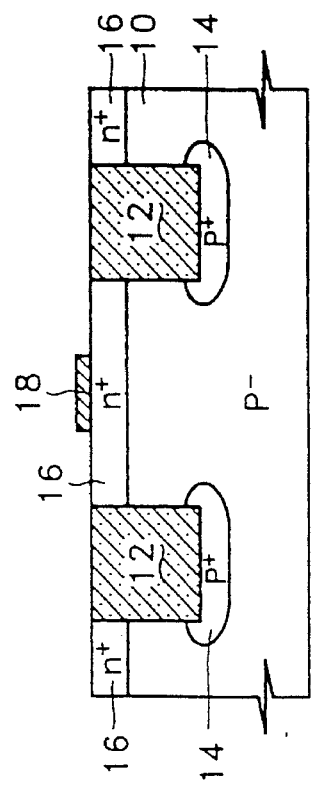

FIGS. 2A to 2C show the steps of forming a bit line 18, wherein FIGS. 2B and 2C are cross-sectional views taken along lines AA' and BB' in FIG. 2A, respectively. First, the nitride pattern 11 is removed and then second conductivity type, e.g., n+ type, impurity ions are implanted in the entire surface of the semiconductor substrate 10, to thereby form an n+ impurity region 16 in the surface of substrate 10. The n+ impurity region 16 is provided for decreasing contact resistance between the bit line and a drain region of a transistor, which will be formed in a subsequent process. Thereafter, a conductive material, e.g., an impurity-doped polysilicon, is deposited on the substrate 10 wherein n+ impurity region 16 is formed and is patterned by a lithographic process, to thereby form bit line 18.

FIGS. 3A and 3B show the steps of forming an insulating film pillar (I), wherein FIGS. 3A and 3B are cross-sectional views taken along lines AA' and BB' in FIG. 2A, respectively. First, a nitride and an oxide are sequentially deposited on the entire surface of the resultant structure wherein bit line 18 is formed, to thereby form a first insulating film 20 and a second insulating film 22. Then, second insulating film 22 and first insulating film 20 are patterned by a lithographic process, to thereby form insulating film pillar (I).

Figure 4D:
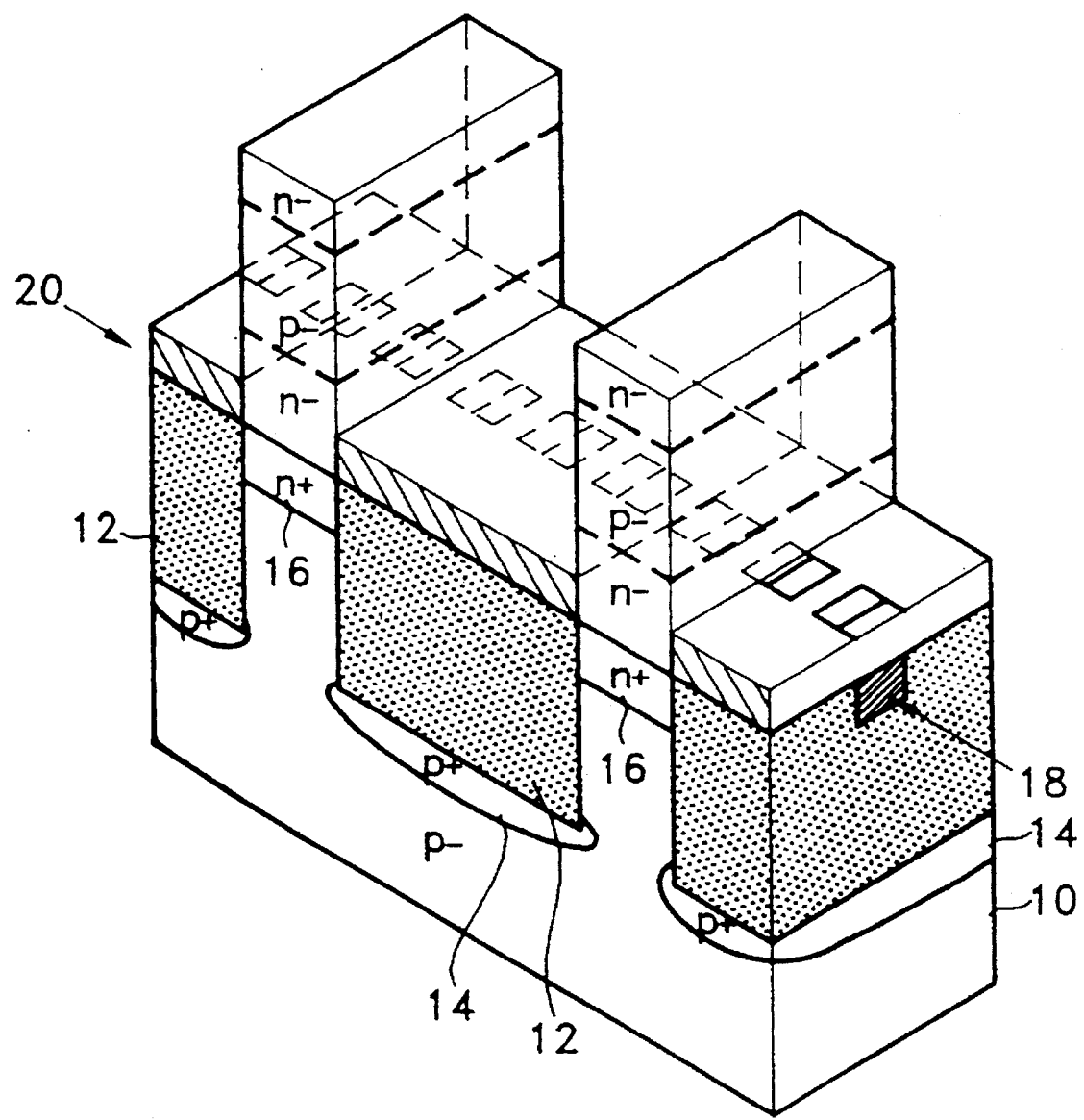

FIGS. 4A to 4D show the steps of forming a drain 23, a channel 24 and a source region 25 of a transistor, wherein FIGS. 4B and 4C are cross-sectional views taken along lines AA' and BB' in FIG. 4A, respectively, and FIG. 4D is a perspective view taken along the line BB'. An n– type first epitaxial semiconductor layer 23 is grown using exposed portions of the semiconductor substrate as a seed. Then, a p– type second epitaxial semiconductor layer 24 and an n– type third epitaxial semiconductor layer 25 are sequentially grown on n– type first epitaxial semiconductor layer 23, to thereby form a silicon pillar. The n– type first epitaxial semiconductor layer 23 serves as the drain, p– type second epitaxial semiconductor layer 25 serves as the channel, and n– type third epitaxial semiconductor layer 25 serves as the source of the NMOS transistor. The n– type first epitaxial semiconductor layer 23 serving as the drain region is connected to bit line 18.

The p– type second epitaxial semiconductor layer 25 which serves as the channel of the NMOS transistor may be grown up to the upper portion of the insulating layer pillar (I), using exposed portions of the substrate as a seed. After that, n– type impurity ions are twice implanted, first with a high energy and then with a low energy, to thereby form drain and source regions 23, 25, on the lower and upper portions of the p– type epitaxial semiconductor layer, respectively. Thereafter, second insulating film 22 is removed. The resultant structure is shown in FIG. 4D.

Figure 5A:
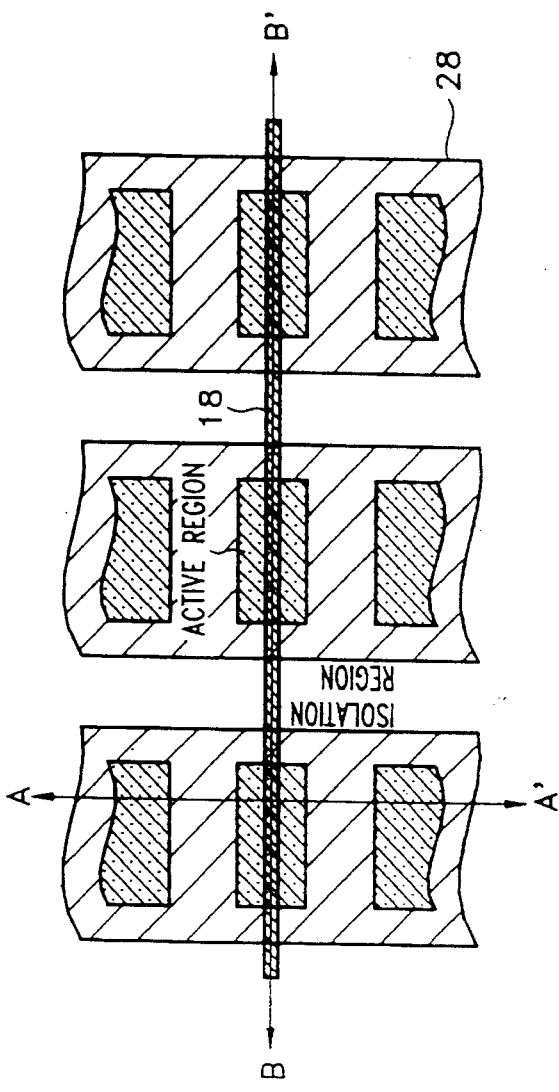
Figure 5C:
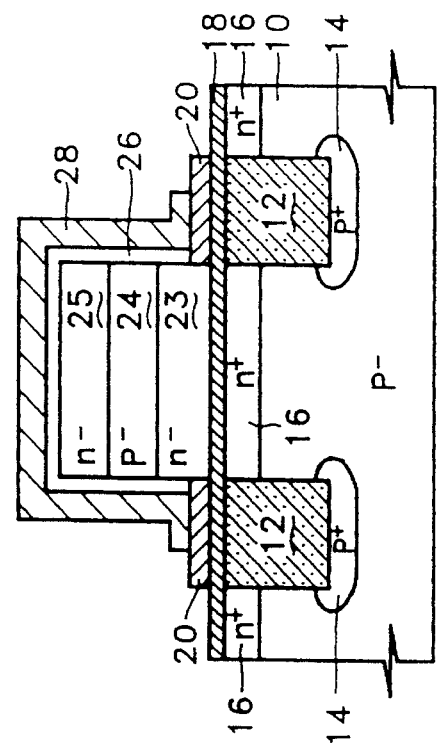
Figure 5B:
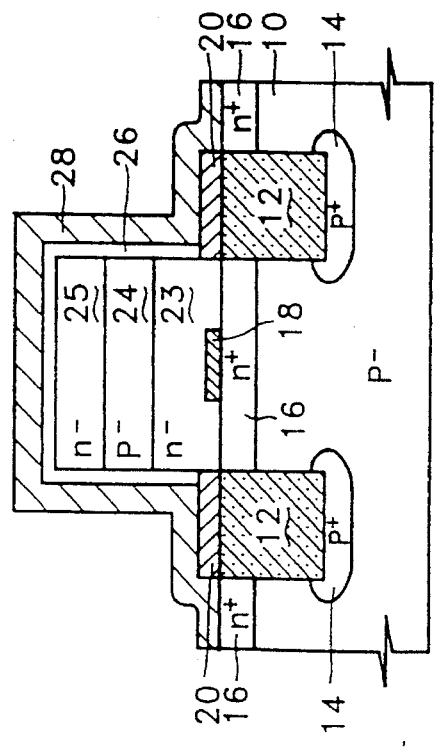

FIGS. 5A to 5C show the steps of forming a gate insulating film 26 and a gate line 28, wherein FIGS. 5B and 5C are cross-sectional views taken along lines AA' and BB' in FIG. 5A, respectively. A thermal oxidation process is performed on the resultant structure shown in FIG. 4D, to thereby form gate insulating film 26 on the surface of the silicon pillar. Then, a conductive layer, e.g., an impurity-doped polysilicon, is deposited on the gate insulating film 26 and the first insulating film 20, and the conductive layer is patterned by a lithographic process, to thereby form gate line 28 surrounding the silicon pillar. The bit line 18 on trench isolation region 12 and the gate line 28 are mutually insulated by first insulating film 20.

Figure 6B:
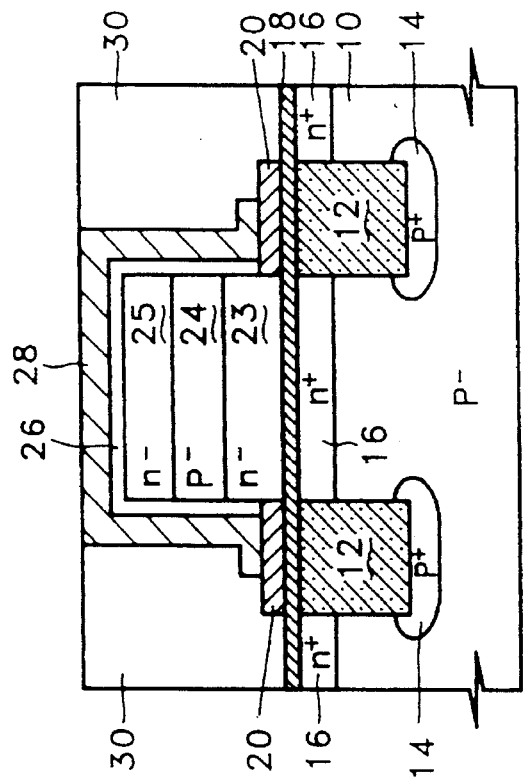
Figure 6A:
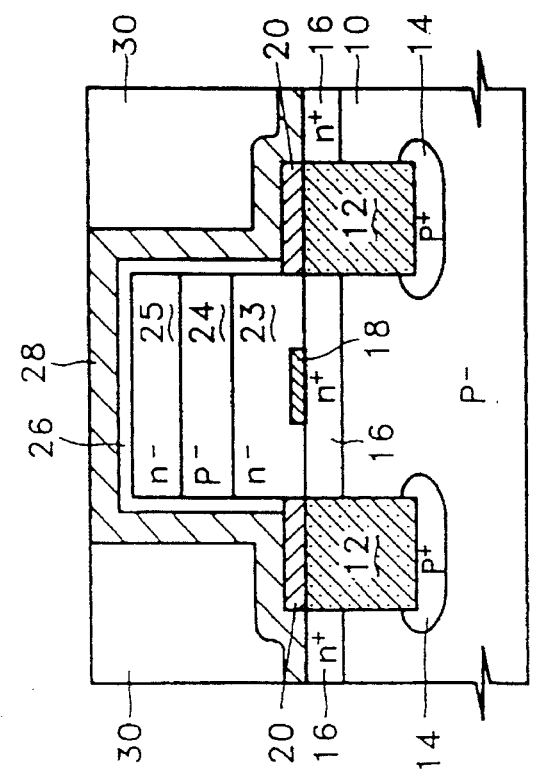

FIGS. 6A and 6B show the steps of forming a planarizing layer 30. An insulating material is deposited on the resultant structure wherein gate line 28 is formed, and then etched back until the top surface of gate line 28 is exposed, to thereby form planarizing layer 30, which eliminates step-differences due to the presence of the silicon pillar.

Figure 7A:
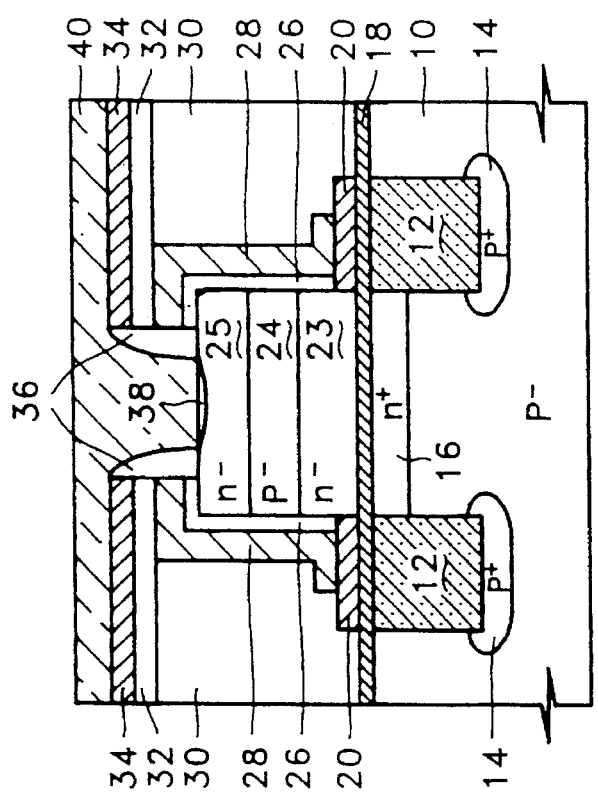
Figure 7B:
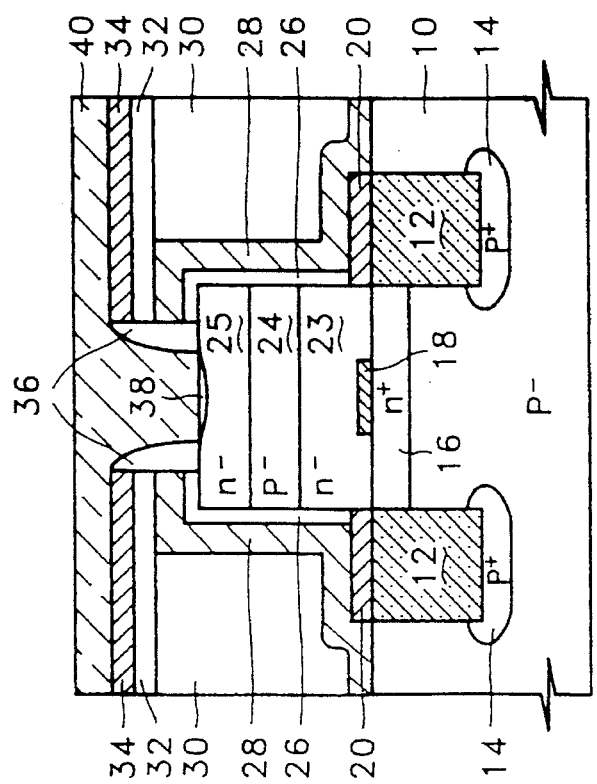

FIGS. 7A and 7B show the steps of forming a contact hole and a first conductive layer 40. Insulating materials, e.g., a high temperature oxide (HTO) and a nitride, are sequentially deposited on the planarizing layer 30 and exposed portions of the gate line 28, to thereby form a first insulating layer 32 and a second insulating layer 34. Optionally, a third insulating layer, e.g., comprised of a high temperature oxide, may be formed on the second insulating layer 34. Thereafter, second insulating layer 34, first insulating layer 32, gate line 28, and a gate insulating film 26, are etched by a lithographic process, to thereby form a contact hole which exposes the source region 25. Then, an insulating material, e.g., a high temperature oxide, is deposited on the resultant structure wherein the contact hole is formed, and then etched, to thereby form an insulating spacer 36 on the sidewalls defining the contact hole. The insulating spacer 36 prevents electrical shorting between gate line 28 and a capacitor storage node which will be formed in a subsequent process step. Thereafter, n+ type impurity ions are implanted through the window defined by the insulating spacer 36, to thereby form an n+ type plug layer 38 in the upper surface of the source region 25. The n+ type plug layer 38 decreases contact resistance between the source region 25 and the capacitor storage node which will be formed in subsequent process steps. Then, a conductive material, e.g., an impurity-doped polysilicon, is deposited on the resultant structure, to thereby form first conductive layer 40.

Figure 8B:
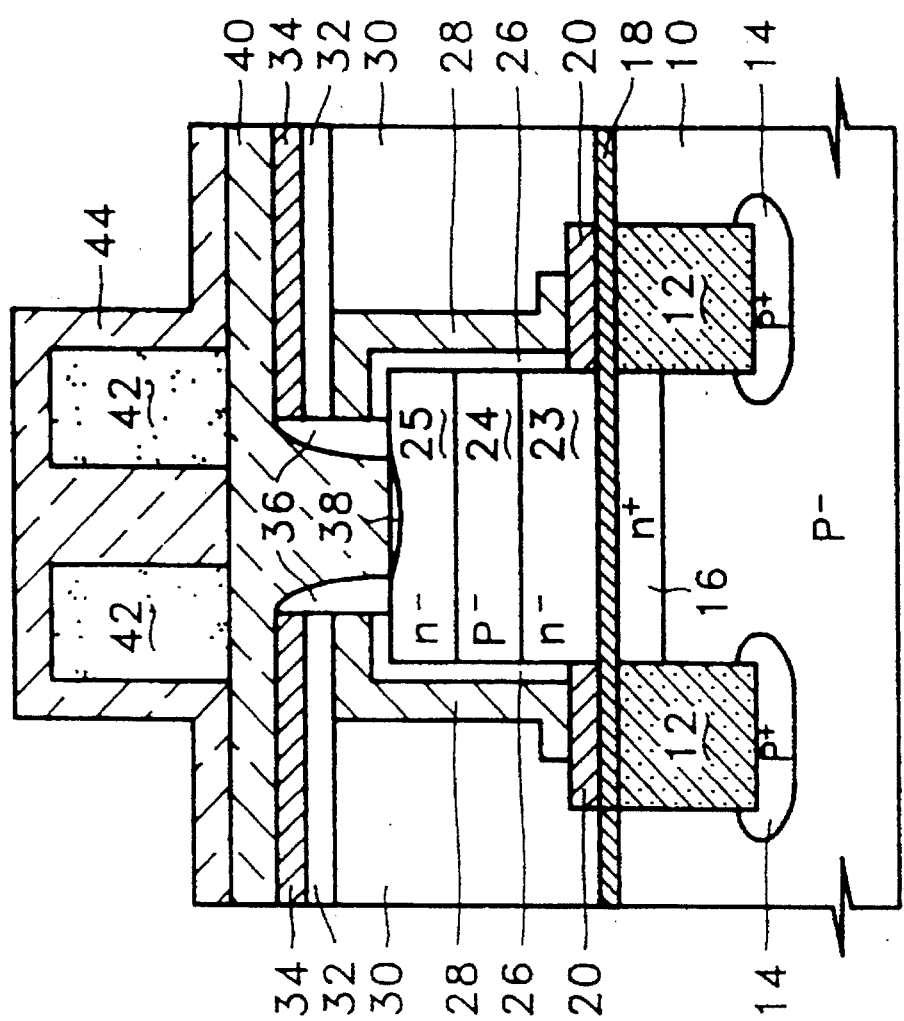
Figure 8A:
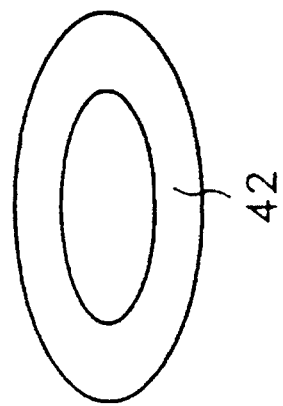

FIGS. 8A and 8B show the steps of forming a mask pattern 42 and a second conductive layer 44, wherein FIG. 8A is a plan view of the structure shown in cross-section in FIG. 8B. A material which has a different etch rate from that of the material constituting first conductive layer 40 with respect to an anisotropic etching process, e.g., a high temperature oxide, is deposited on first conductive layer 40. Then, the material is patterned by a lithographic process, to thereby form mask pattern 42. Thereafter, a conductive material which has a different etch rate from that of the material constituting mask pattern 42 and which has the same or a similar etch rate as that of the material constituting first conductive layer 40, e.g., an impurity-doped polysilicon, is deposited on the resultant structure, to thereby form second conductive layer 44.

Figure 10:
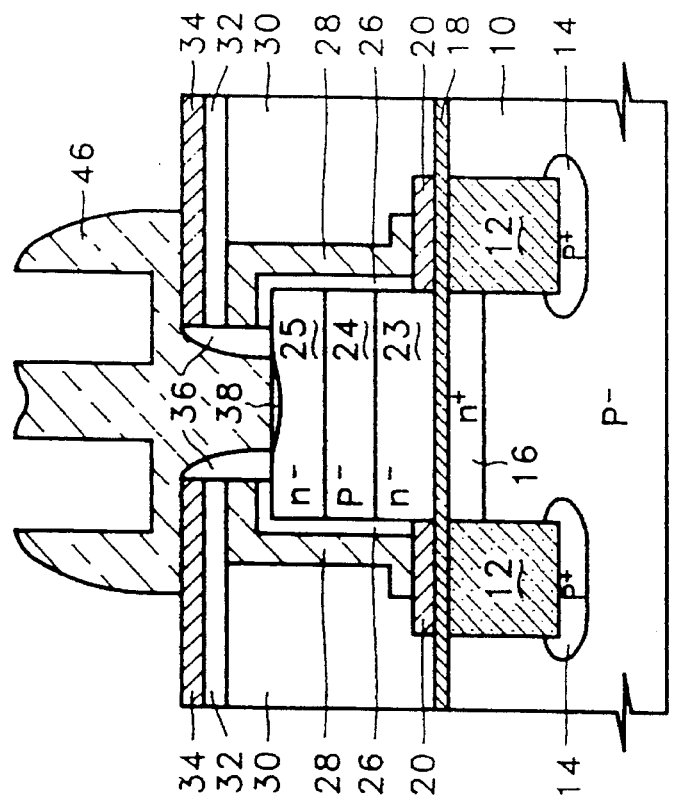
Figure 9:
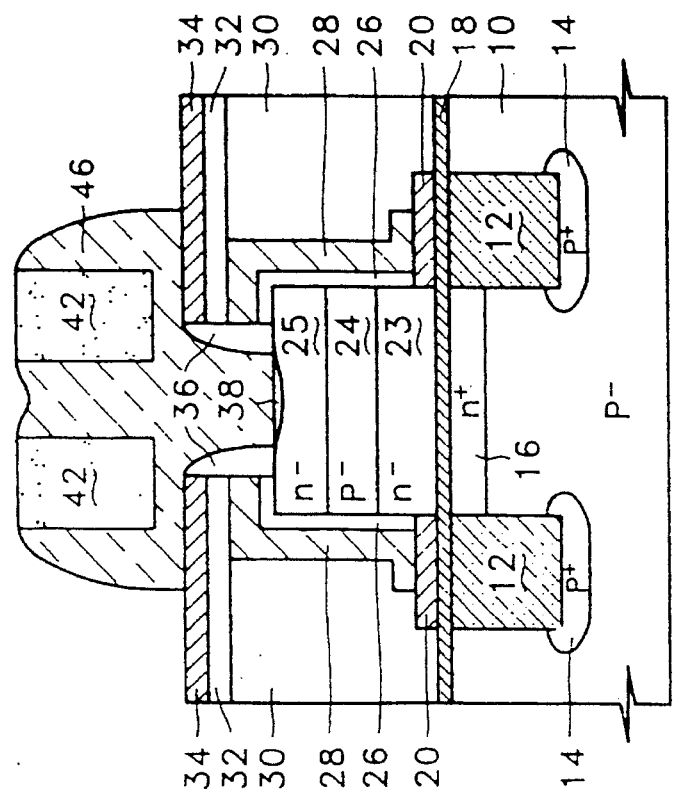

FIGS. 9 and 10 show the steps of forming a storage node 46 of a capacitor. First and second conductive layers 40 and 44 are etched back using mask pattern 42 as an etch-mask, to thereby form double cylindrical storage node 46 connected to source region 25 of the transistor. Then, the mask pattern 42 is removed.

FIGS. 11 through 17 are plan views and cross-sectional views illustrating a method for manufacturing a semiconductor device according to a second embodiment of the present invention.

Figure 11:
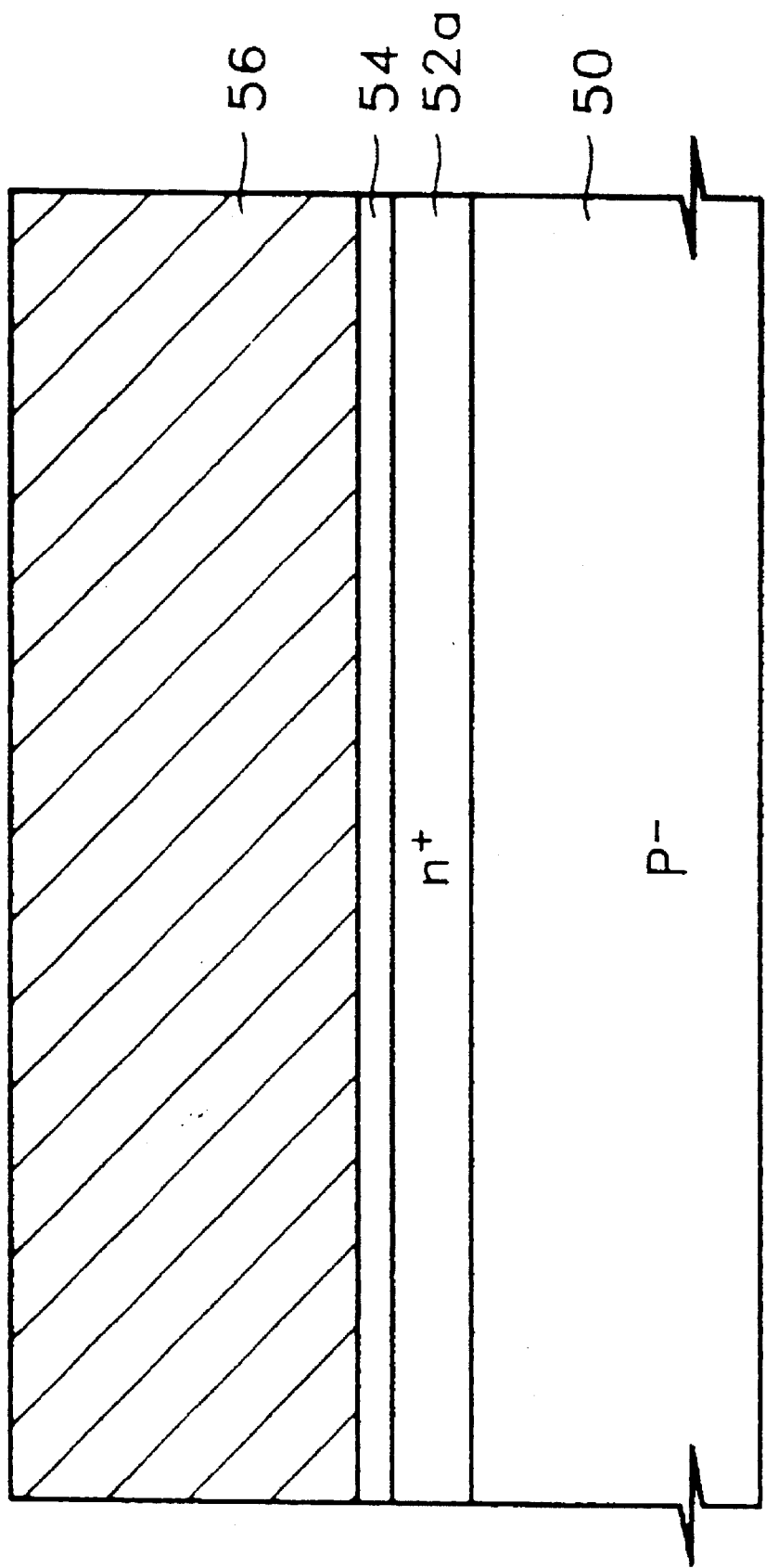
FIGS. 11, 12A–12B, 13, 14, 15A–15B, 16 and 17 illustrate a method for manufacturing a semiconductor device according to a second embodiment of the present invention.

FIG. 11 shows the steps of forming an n+ type epitaxial semiconductor layer 52a, and first and second material layers 54 and 56. An n+ type epitaxial semiconductor layer 52a is grown on a p– type semiconductor substrate 50, using the substrate as a seed. Alternatively, the n+ type epitaxial semiconductor layer 52a may be formed by an ion-implantation process. Then, an oxide and a nitride are sequentially deposited on the n+ type epitaxial semiconductor layer 52a, to thereby form first material layer 54 and second material layer 56. The height of the second material layer 56 determines the height of the transistor to be formed subsequently.

Figure 12A:
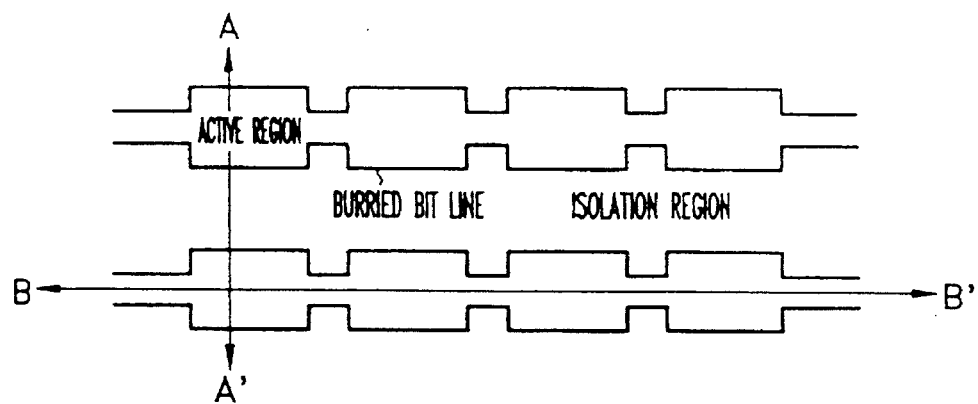
Figure 12B:
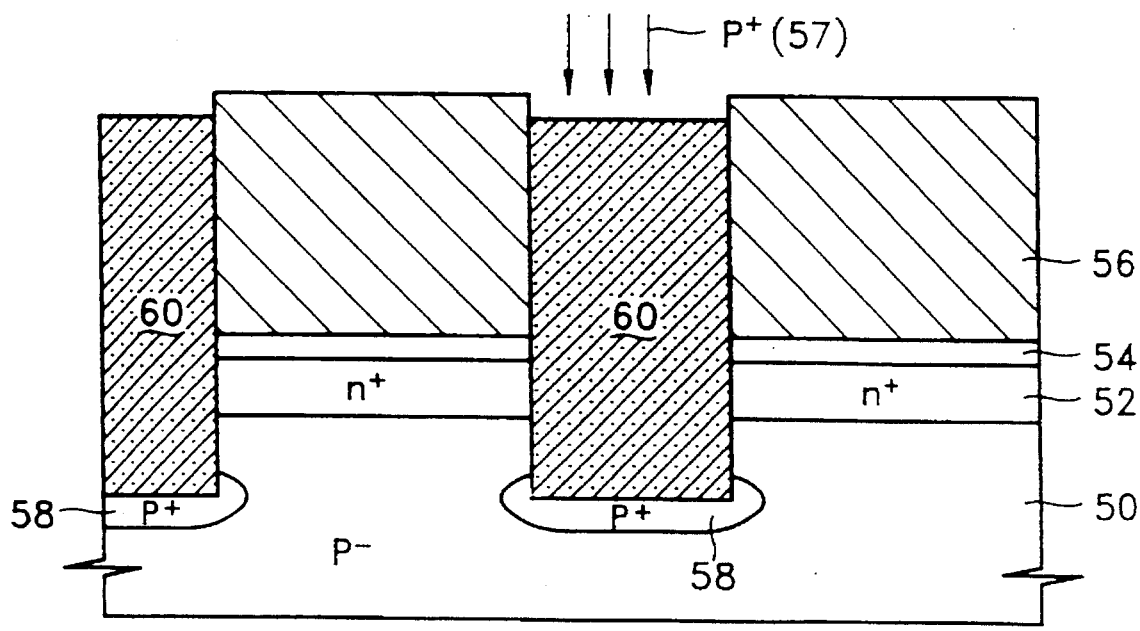

FIGS. 12A and 12B show the step of forming a bit line 52 and a trench isolation region 60. FIG. 12B is a cross sectional view taken along line AA' in FIG. 12A. After etching the portion of second and first material layers 56 and 54 where the isolation region is to be formed, e.g., by a lithographic process, n+ type epitaxial semiconductor layer 52a is etched using the remaining portions of the second and first material layers 56 and 54 as a mask. Next, substrate 50 is etched to a predetermined depth, thereby forming a trench therein, and thereby patterning the n+ type epitaxial semiconductor layer 52a to thereby form a buried bit line 52, with the active regions in the bit line direction (BB' direction in FIG. 12A) being connected.

Thereafter, for enhancing the electrical insulation between adjacent devices, p+ type impurity ions 57 are implanted through an opening formed in the layers 52, 54, and 56 and the trench formed in the substrate 50, to thereby form a p+ impurity layer 58 beneath the trench. Then, an insulating material, e.g., an oxide, is deposited through the above-described opening, and is etched back, so as to fill the interior of the trench with the insulating material, thereby forming trench isolation region 60.

Figure 13:
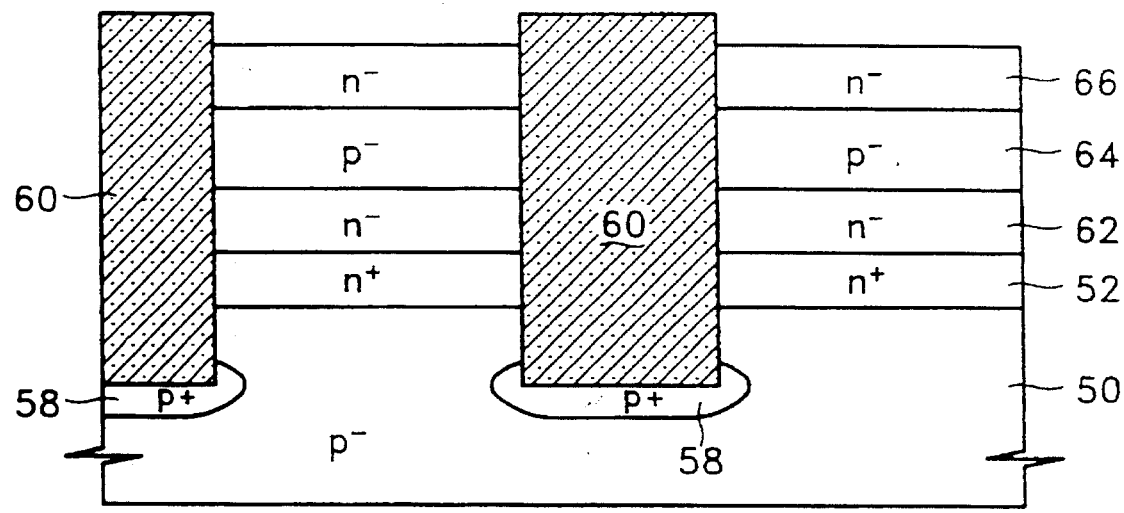

FIG. 13 shows the steps of forming a drain 62, a channel 64 and a source region 66 of a transistor. After removing first and second material layers 54 and 56, an n– type first epitaxial semiconductor layer 62 is grown on exposed portions of the bit line 52. Next, a p– type second epitaxial semiconductor layer 64 and an n– type third epitaxial semiconductor layer 66 are sequentially grown on n– type first epitaxial semiconductor layer 62, to thereby form a silicon pillar. The n– type first epitaxial semiconductor layer 62 serves as the drain of the NMOS transistor, and p– type second epitaxial semiconductor layer 64 and n– type third epitaxial semiconductor layer 66 serves as the channel and the source of the NMOS transistor, respectively. The n– type first epitaxial semiconductor layer 62 serving as the drain region is connected to n+ type epitaxial semiconductor layer serving as the bit line 52.

Alternatively, the silicon pillar can be formed as follows. The p– type epitaxial semiconductor layer 64 which will serve as the channel of the NMOS transistor may be grown on the bit line 52, and the drain region 62 and source region 66 can then be formed by first implanting n– type impurity ions with a high energy, and then secondly, with a low energy.

Figure 14:
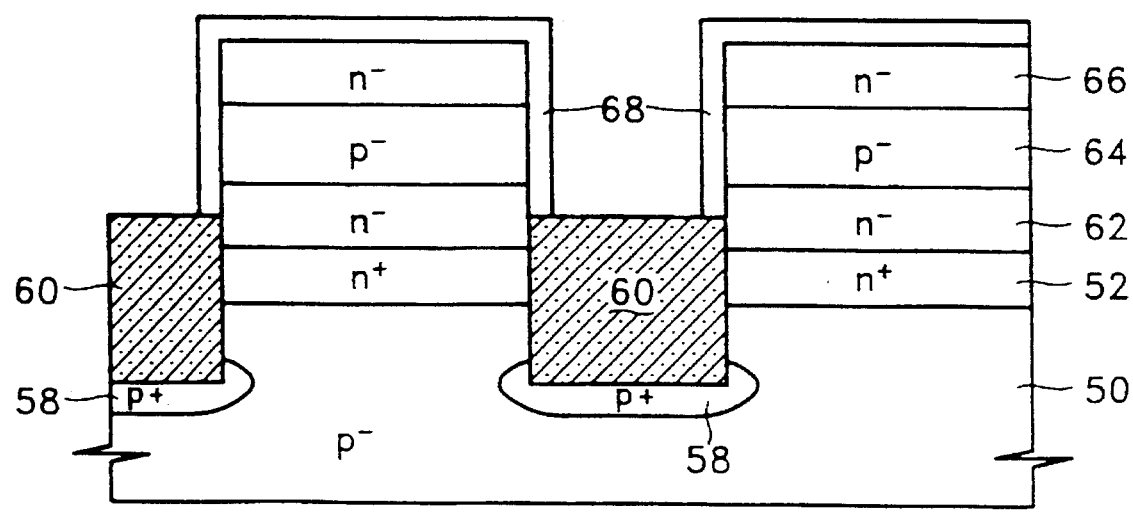

FIG. 14 shows the steps of forming a gate insulating film 68. First, the drain 62, channel 64, and source 66 of the transistor are exposed by etching away the insulating material within the trench isolation region 60 down to the drain region 62. Thereafter, a thermal oxidation process is performed on the resultant structure, to thereby form gate insulating film 68 on the surface of the silicon pillar.

Figure 15A:
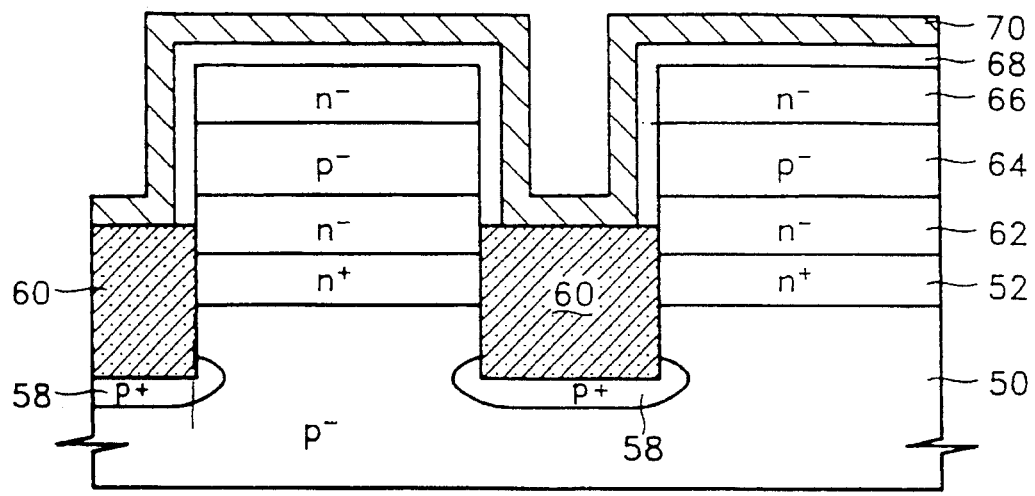
Figure 15B:
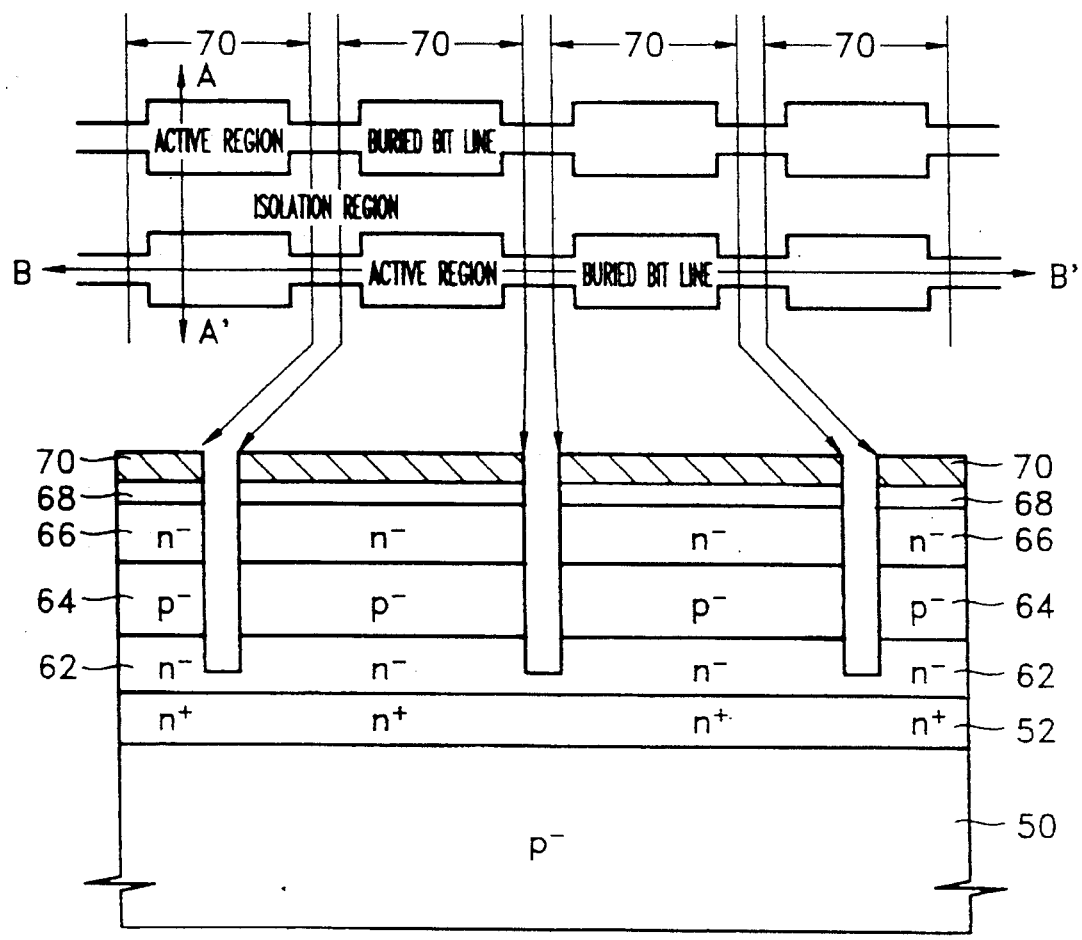

FIGS. 15A and 15B show the steps of forming a gate line 70, FIG. 15A is a cross-sectional view taken along line AA' of the plan view shown in the upper part of FIG. 15B, and the lower part of FIG. 15B is a cross-sectional view taken along line BB' of the plan view depicted in the upper part of FIG. 15B. First, a conductive layer, e.g., an impurity-doped polysilicon is deposited on the gate insulating film 68 and exposed portions of the trench isolation region 60. Then, the conductive layer, gate insulating film 68 and the silicon pillar are etched by a lithographic process, to thereby form gate line 70 surrounding the silicon pillar.

Figure 16:
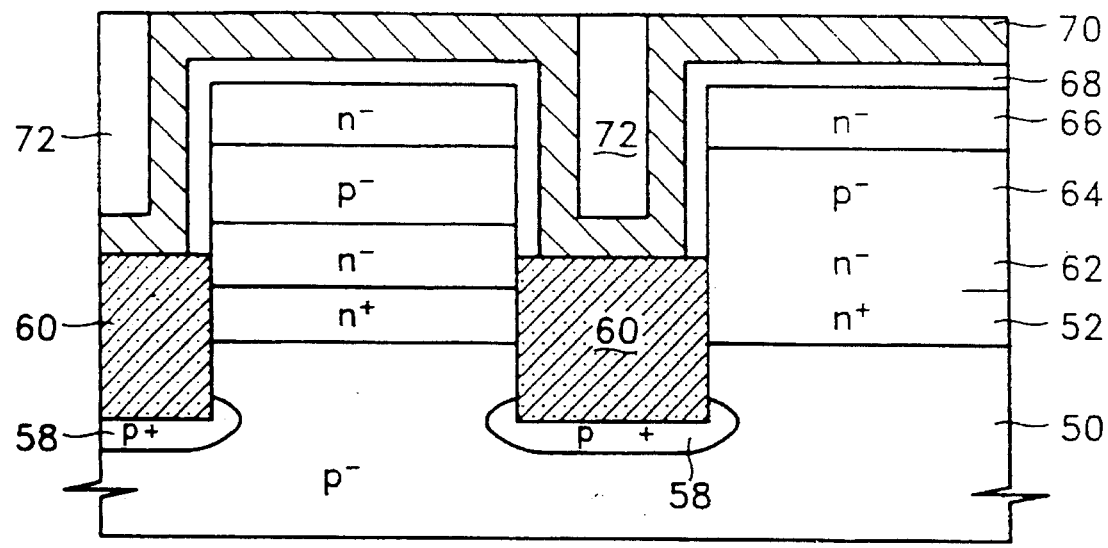

FIG. 16 shows the step of forming a planarizing layer 72. First, an insulating material is deposited on the gate line 70, and then the insulating material layer is etched back until the top surface of gate line 70 is exposed, to thereby form the planarizing layer 72. The planarizing layer 72 preferably completely fills the recess between adjacent silicon pillars.

Figure 17:
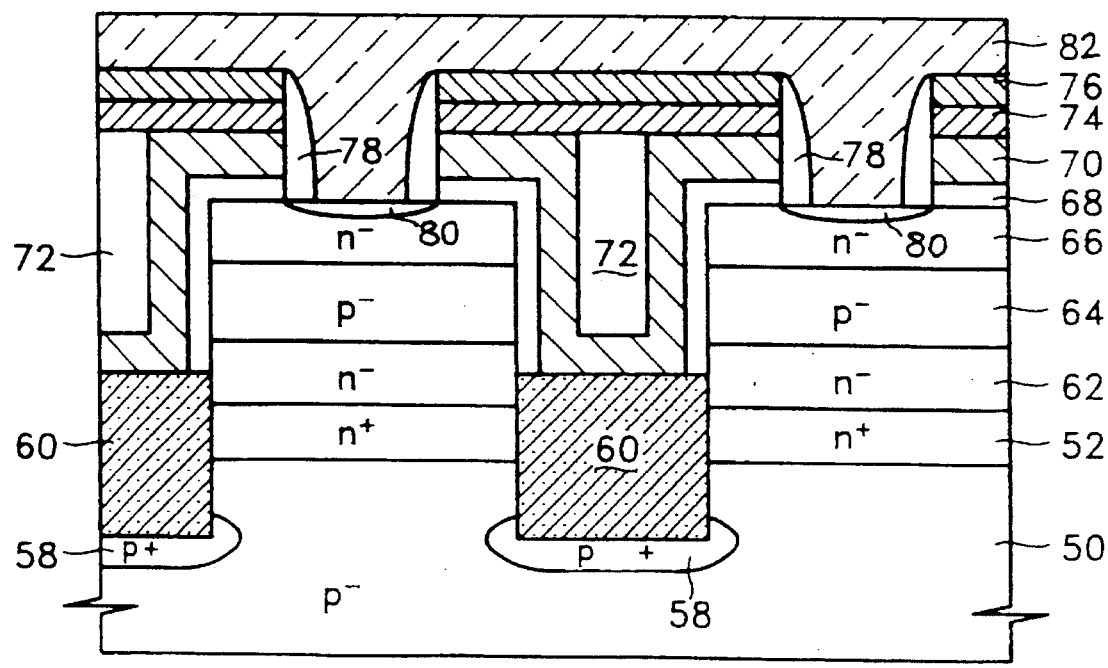

FIG. 17 shows the step of forming a contact hole and a first conductive layer 82. Insulating materials, e.g., a high temperature oxide and nitride, are sequentially deposited on the planarizing layer 72 and exposed portions of the gate line 70, to thereby form a first insulating layer 74 and a second insulating layer 76. Thereafter, portions of the second insulating layer 76, first insulating layer 74, gate line 70, and gate insulating film 68 which lie above the source region 66 of the transistor, are etched by a lithographic process, to thereby form a contact hole which exposes the source region 66. Then, an insulating material, e.g., a high temperature oxide, is deposited on the resultant structure wherein the contact hole is formed, and is then etched, to thereby form insulating spacer 78 on the sidewalls defining the contact hole. Thereafter, n+ type impurity ions are implanted through a window defined by the insulating spacer 78, to thereby form an n+ type plug 80 in the upper surface of source region 66. Then, a conductive material, e.g., an impurity-doped polysilicon, is deposited on the resultant structure, to thereby form first conductive layer 82. Thereafter, though not shown, a process sequence for manufacturing a storage node of a capacitor is performed by the method described previously in connection with the first embodiment.

Thus, in accordance with the second embodiment of the present invention, the epitaxial semiconductor layer 52 is simultaneously used as the active region and the bit line, and the trench isolation region and the silicon pillar can be formed by a single lithographic process, and thus, two lithographic process steps are omitted, relative to the first embodiment.

FIGS. 18 through 26 are plan views and cross-sectional views illustrating a method for manufacturing a semiconductor device according to a third embodiment of the present invention.

Figure 18:
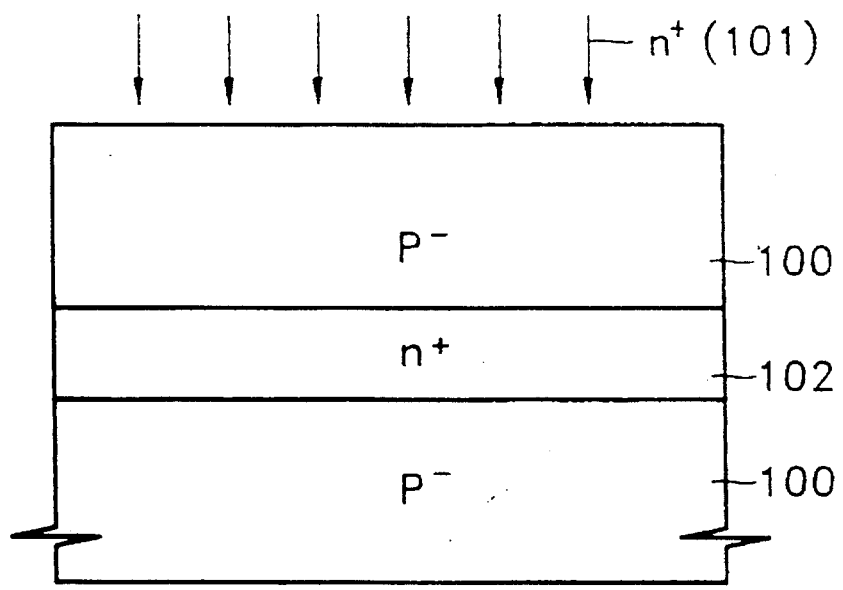

FIG. 18 shows the step of forming an n+ type buried impurity layer 102. First, n+ type first impurity ions 101 are implanted at a high energy on the entire surface of a p– type semiconductor substrate 100, to thereby form n+ type buried impurity layer 102 at a predetermined depth of substrate 100. Alternatively, n+ type buried impurity layer 102 may be formed on the substrate 100 by an epitaxial process.

Figure 19:
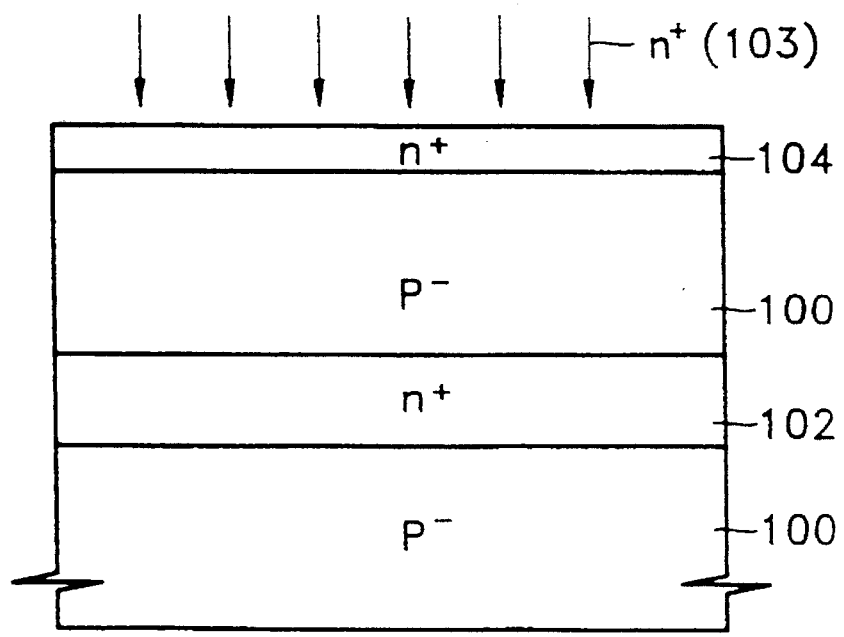

FIG. 19 shows the step of forming an n+ type surface impurity layer 104. First n+ type second impurity ions 103 are implanted on the entire surface of the substrate 100, to thereby form n+ type surface impurity layer 104 in the surface of substrate 100. The n+ type surface impurity layer 104 serves as a source region of an NMOS transistor, n+ type buried impurity layer 102 serves as a drain region, and p– type substrate 100 disposed therebetween serves as a channel region.

In the case where n+ type buried impurity layer 102 is formed by an epitaxial process as described in connection with FIG. 18, a p– type epitaxial semiconductor layer is grown on n+ type buried impurity layer 102, and then an n+ type epitaxial semiconductor layer is grown thereon, to thereby form n+ type surface impurity layer 104. Alternatively, the n+ type surface impurity layer 104 may be formed by depositing an n+ type impurity-doped polysilicon on substrate 100.

Figure 20A:
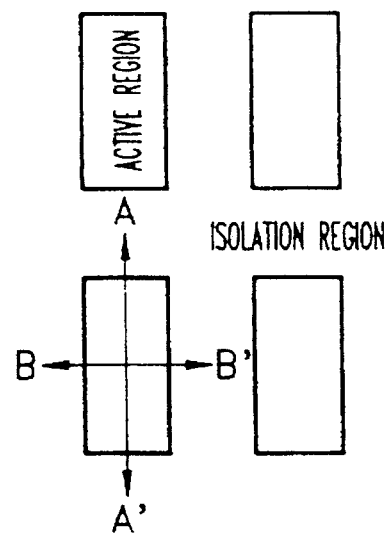
Figure 20B:
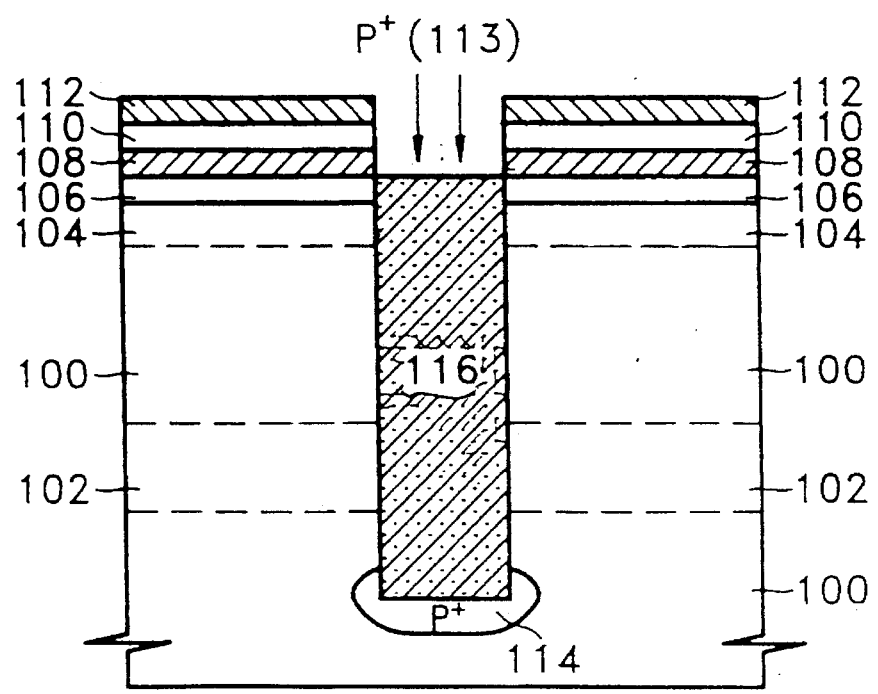

FIGS. 20A and 20B show the step of forming a trench isolation layer 116. A first oxide film 106, a polysilicon film 108, a second oxide film 110, and a nitride film 112 are sequentially formed on the resultant structure shown in FIG. 19. The films 106, 108, 110, and 112 together serve as a mask layer for forming a trench isolation region. Thereafter, the mask layer is etched by a lithographic process to form a window. Then, the substrate 100 is deeply etched to below the drain region 102, using the mask layer as an etch-mask, to thereby form a first trench. Then, for strengthening the electrical insulation between the devices, p+ type impurity ions 113 are implanted through the window in the mask layer to thereby form a p+ impurity layer 114 beneath the first trench. Thereafter, an insulating material, e.g., an oxide, is deposited on the entire surface of the resultant structure, and is etched back to fill the interior of the first trench with the insulating material, thereby forming trench isolation region 116. The insulating material is preferably etched back to first oxide film 106.

Figure 21B:
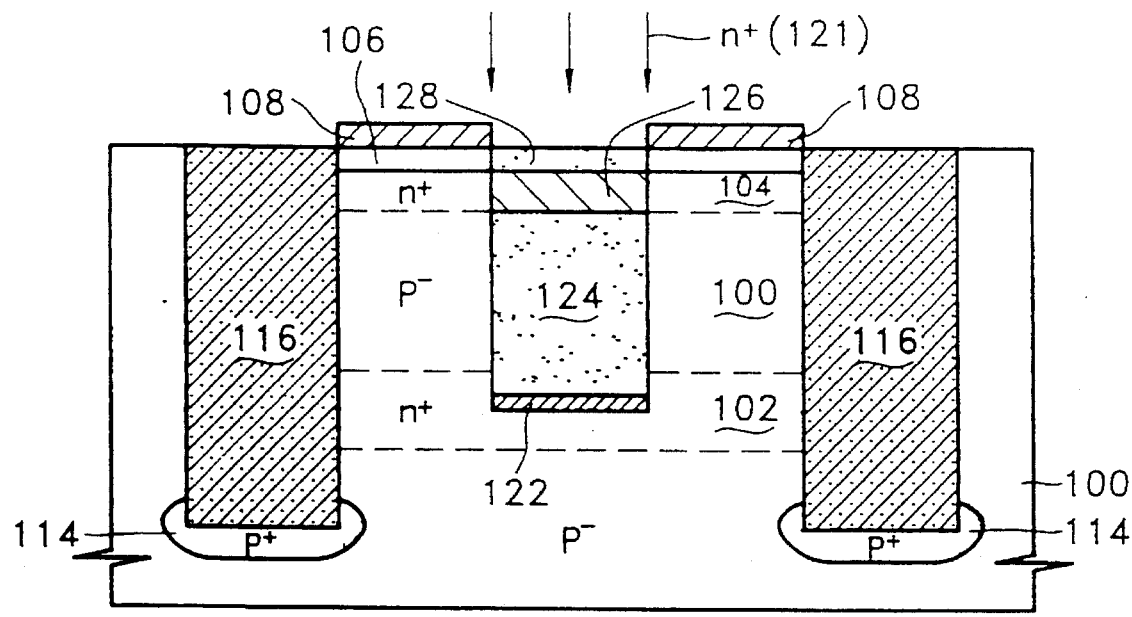
Figure 21C:
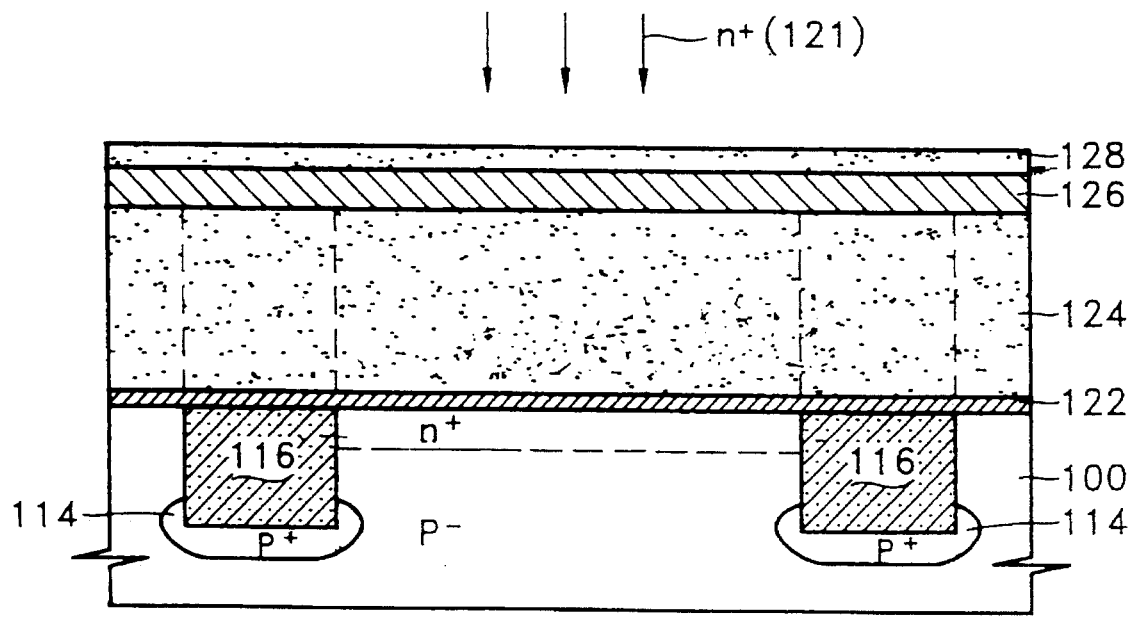

FIGS. 21A to 21C show the steps of forming a buried bit line 122, and FIGS. 21B and 21C are cross-sectional views taken along lines AA' and BB' in FIG. 21A, respectively. A predetermined portion of an active region between adjacent trench isolation regions 116 is etched through a suitable window formed in the layers 106, 108, 110, 112, down to drain region 102 by a lithographic process, to thereby form a second trench for forming a buried bit line. During the process of etching the second trench, the etch selectivity of silicon and an oxide filling trench isolation region 116 should be maintained at 1:1 for preventing the formation of a stepped portion on the buried bit line.

Then, n+ type impurity ions 121 are implanted through the window formed in the layers 106, 108, 110, 112 to thereby form an n+ type impurity layer (not shown) beneath the second trench. Thereafter, a conductive material, e.g., an impurity-doped polysilicon, is deposited in the second trench, and then etched back, to thereby form buried bit line 122. Then, an oxide is deposited on the bit line 122, and then etched back, to thereby form a first insulating film 124. A nitride is deposited on first insulating film 124 and is etched back, to thereby form a second insulating film 126. Then, the nitride film 112 is removed. Thereafter, an oxide is deposited on the resultant structure and is etched back to form a third insulating film 128. Then, the second oxide film 110 is removed. The location of second insulating layer 126 determines the resultant thicknesses of bit line 122 and first insulating film 124 during subsequent process steps for forming a silicon pillar, and prevents the generation of a gate stringer during a subsequent process of etching a gate line.

Figure 22A:
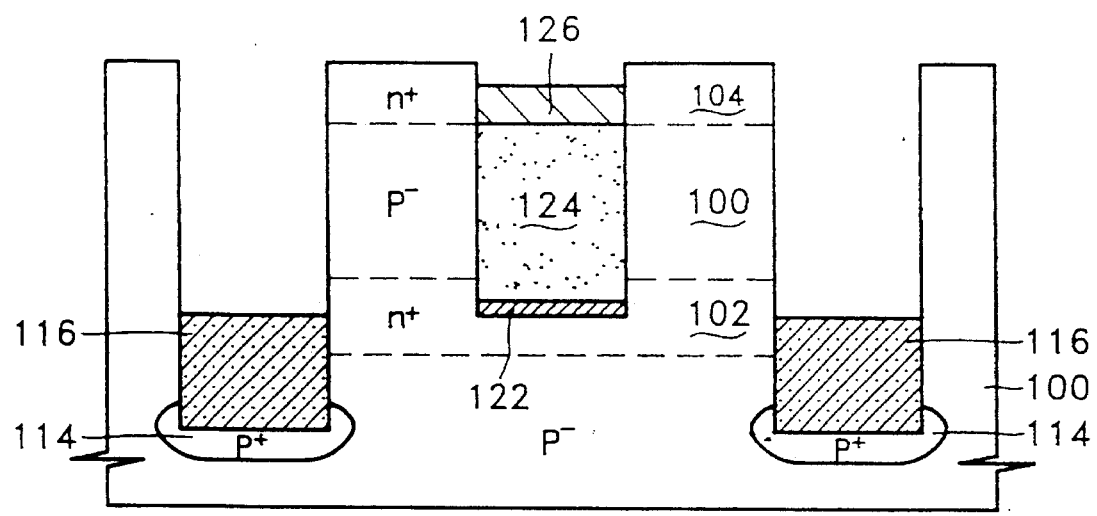
Figure 22B:
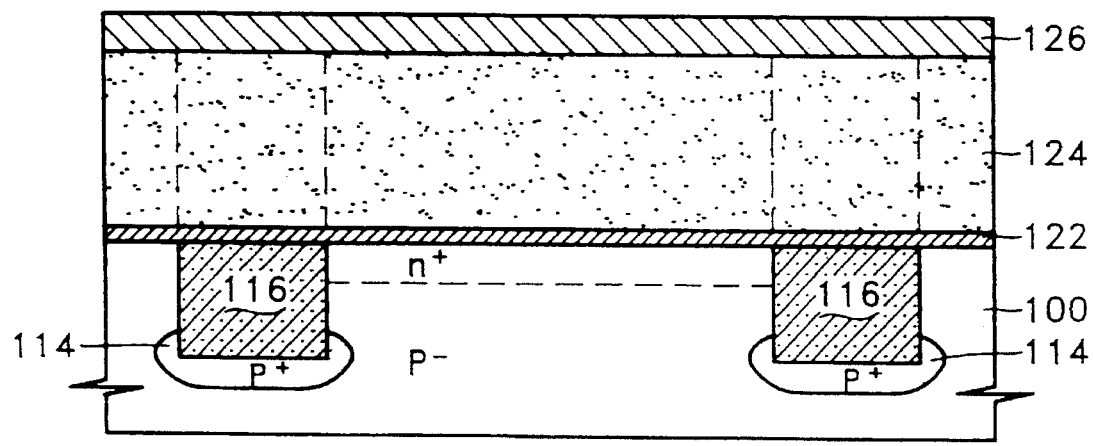

FIGS. 22A and 22B show the steps of forming a silicon pillar. FIGS. 22A and 22B are cross-sectional views taken along lines AA' and BB' in FIG. 21A, respectively. The insulating material layer within trench isolation region 116 is etched down to drain region 102, to thereby form a silicon pillar comprised of drain 102, channel 100, and source 104. The second insulating film 128 is also preferably removed during the above etching process. Thereafter, polysilicon film 108 and first oxide film 106 are removed, e.g., a wet etching process.

Figure 23A:
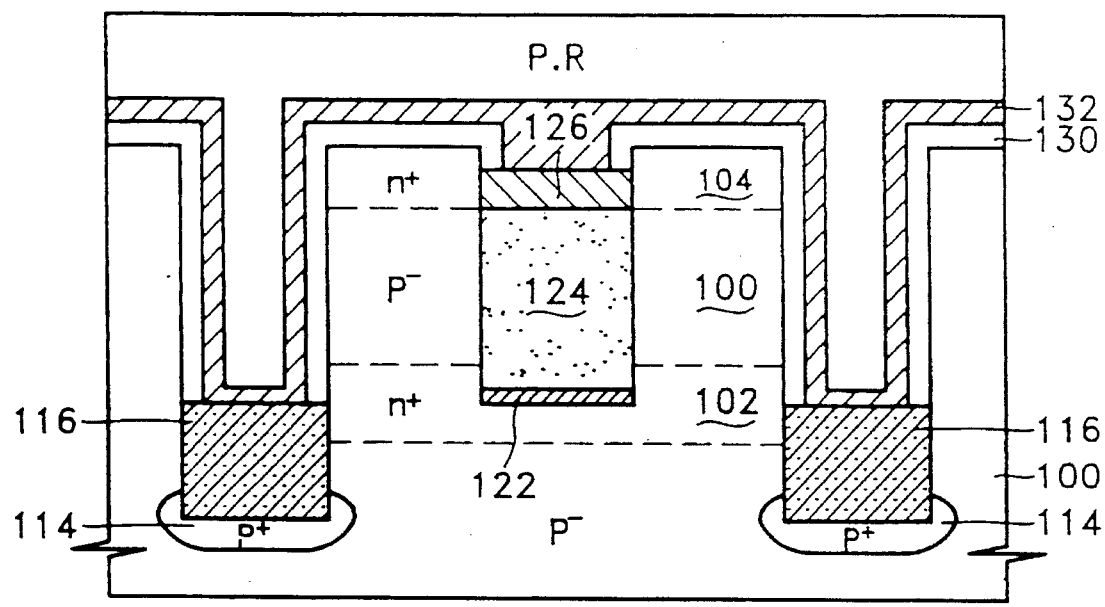
Figure 23B:
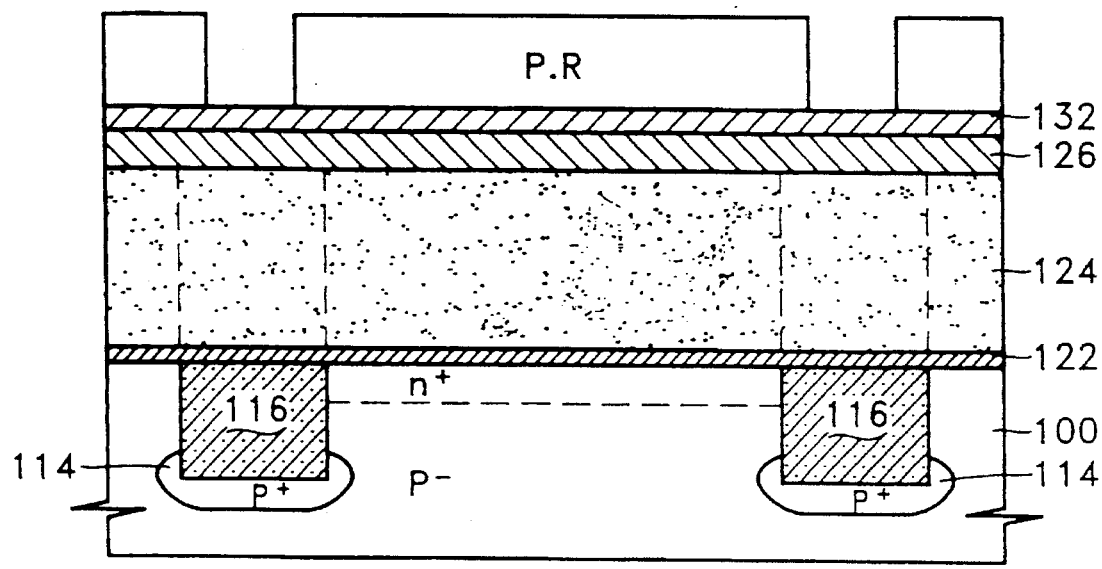
Figure 24:
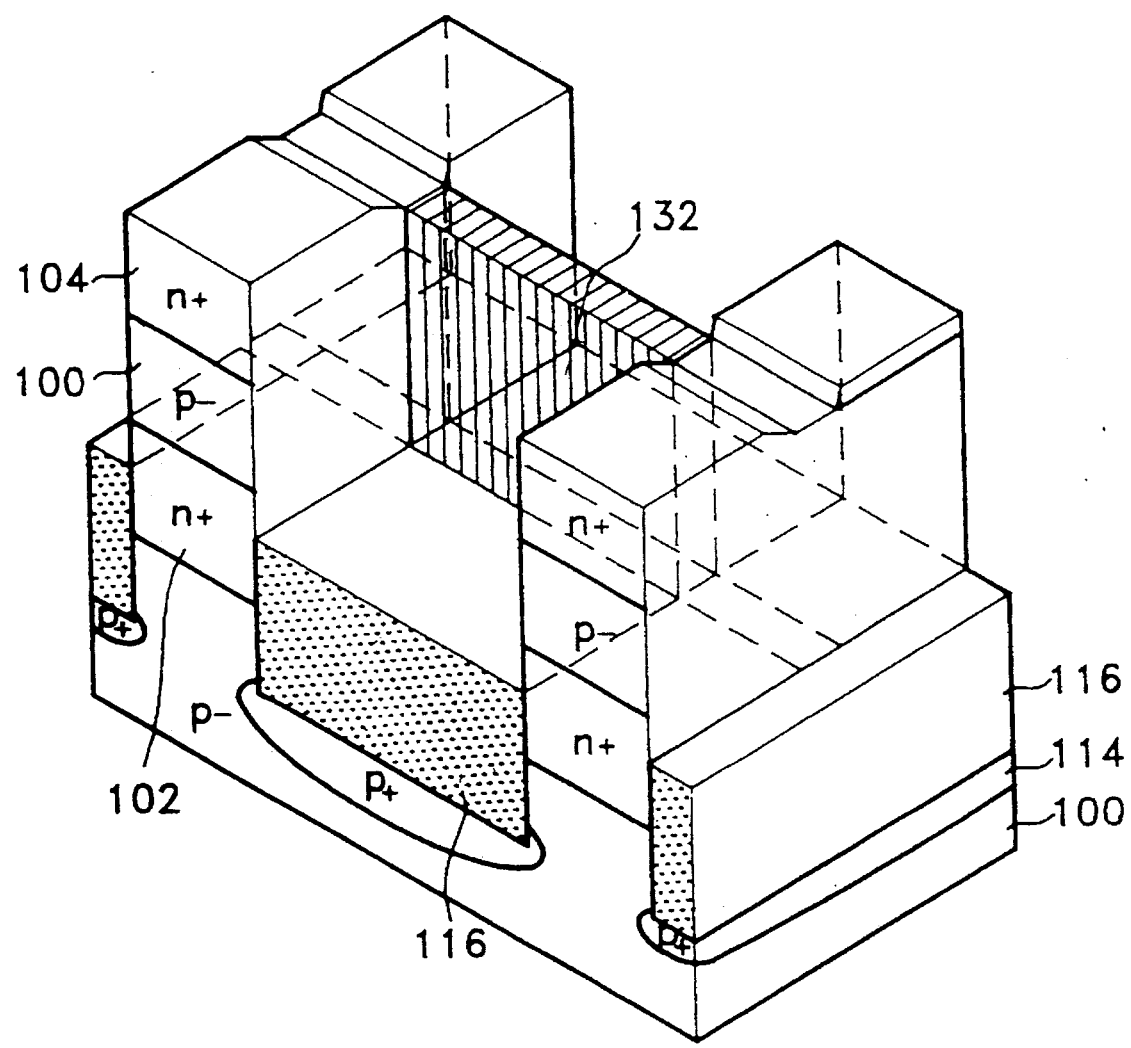

FIGS. 23A and 23B show the steps of forming a gate insulating film 130 and a gate line 132. A thermal oxidation process is performed on the resultant structure wherein the silicon pillar is formed, to thereby form gate insulating film 130 on the surface of the silicon pillar. Then, a conductive layer, e.g., an impurity-doped polysilicon, is deposited on the gate insulating film 130 and exposed portions of the trench isolation region 116. Next, the conductive layer is etched by a lithographic process, to thereby form gate line 132 surrounding the silicon pillar. FIG. 24 is a perspective view showing the resultant structure.

Figure 25:
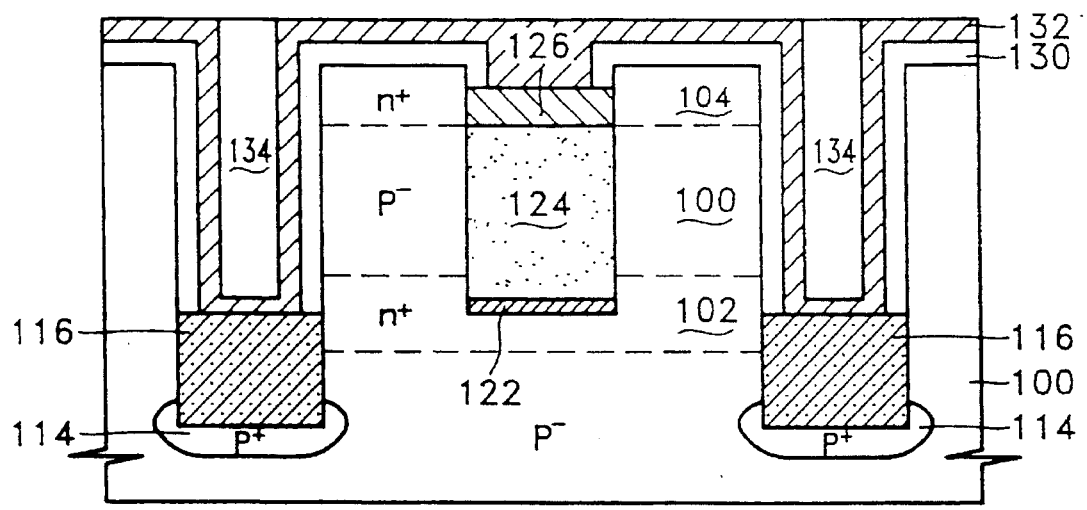

FIG. 25 shows the step of forming a planarizing layer 134. First, an insulating material is deposited on the gate line 132. Then, the insulating material is etched back until the top surface of the gate line 132 is exposed, to thereby form the planarizing layer 134.

Figure 26:
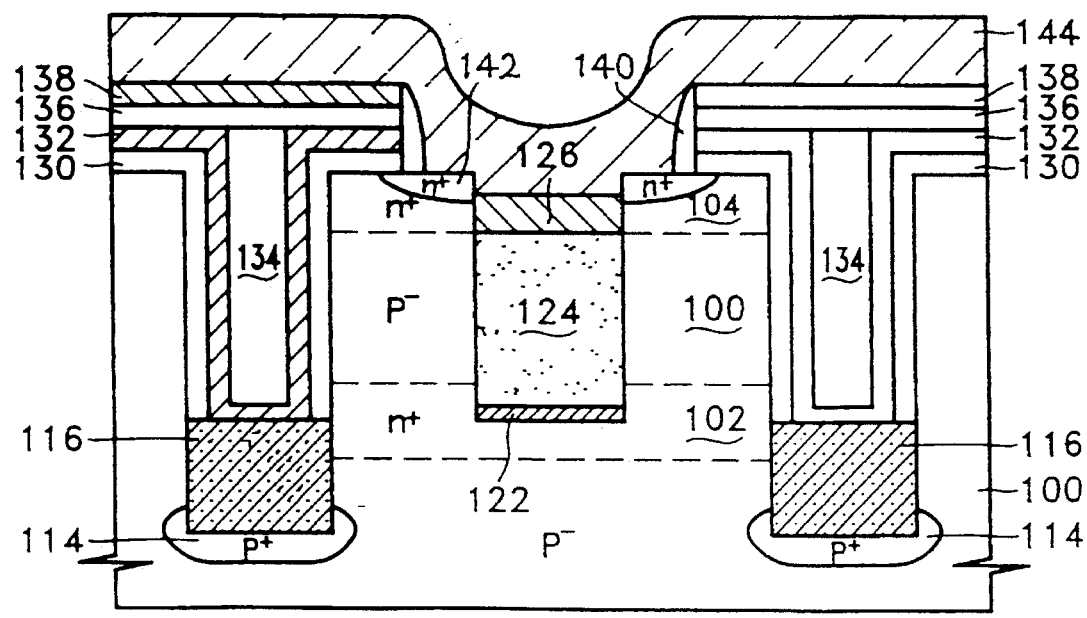

FIG. 26 shows the step of forming a contact hole and a first conductive layer 144. Insulating materials, e.g., a high temperature oxide and a nitride, are sequentially deposited on the planarizing layer 134 and exposed portions of the gate line 132, to thereby form a first insulating layer 136 and a second insulating layer 138. Thereafter, portions of the second insulating layer 138, first insulating layer 136, gate line 132, and gate insulating film 130 which lie above the source region 104 of the transistor are etched, to thereby form a contact hole which exposes the source region 104. Then, an insulating material, e.g., a high temperature oxide, is deposited on the resultant structure wherein the contact hole is formed, and is etched, to thereby form an insulating spacer 140 on the sidewalls of the contact hole. Thereafter, n+ type impurity ions are implanted through a window defined by the insulating spacer 140, to thereby form an n+ type plug layer 142 in the upper surface of source region 104. Then, a conductive material, e.g., an impurity-doped polysilicon, is deposited on the resultant structure, to thereby form first conductive layer 144. Thereafter, though not shown, a process sequence for manufacturing a storage node of a capacitor is performed by the method described previously in connection with the first embodiment.

According to the third embodiment of the present invention, the buried bit line and the silicon pillar can be formed without selectively growing an epitaxial semiconductor layer. Also, the contact hole area is reduced due to the buried bit line being located in a central portion of the silicon pillar.

Thus, in accordance with the third embodiment of the present invention, a buried bit line structure and a vertical gate structure surrounding a silicon pillar are formed, and thus, the maximum effective active area can be utilized.

Although several preferred embodiments of the present invention have been described hereinabove, it should be clearly understood that many variations and/or modifications of the basic inventive concepts herein taught which may appear to those skilled in the pertinent art, will still fall within the spirit and scope of the present invention, as defined in the appended claims.

What is claimed is:

1. A method for manufacturing a semiconductor device comprising the steps of:

forming a buried impurity layer of a second conductivity type in a semiconductor substrate of a first conductivity type;

forming a surface impurity layer of said second conductivity type in a surface portion of said semiconductor substrate wherein said buried impurity layer is formed;

forming a first trench isolation region in order to define an active region in said semiconductor substrate wherein said surface impurity layer is formed;

etching said active region deeper than said buried impurity layer, to thereby form a second trench;

forming a bit line in a lower portion of said second trench;

filling an interior of said second trench wherein said bit line is formed, with an insulating material;

etching said first trench isolation region to said buried impurity layer, to thereby form a silicon pillar comprised of said buried impurity layer of said second conductivity type, said semiconductor substrate of said first conductivity type, and said surface impurity layer of said second conductivity type;

forming a gate insulating film and a gate line sequentially so as to surround said silicon pillar;

depositing an insulating material on the resultant structure wherein said gate line is formed, and etching back said insulating material to thereby form a planarizing layer;

forming an insulating layer on the resultant structure wherein said planarizing layer is formed;

etching said insulating layer partially to thereby form a contact hole for exposing said surface impurity layer in said silicon pillar; and, forming a storage node of a capacitor connected to said surface impurity layer through said contact hole, on the resultant structure wherein said contact hole is formed.

2. The method for manufacturing a semiconductor device as set forth in claim 1, wherein said buried impurity layer and said surface impurity layer of said second conductivity type are formed by an epitaxial process.

3. The method for manufacturing a semiconductor device as set forth in claim 1, wherein said buried impurity layer of said second conductivity type is formed by implanting first impurity ions of said second conductivity type in said semiconductor substrate at a first energy, and said surface impurity layer of said second conductivity type is formed by implanting second impurity ions of said second conductivity type in said semiconductor substrate at a second energy which is lower than said first energy.

* * * * *